United States Patent
Mitchell

(10) Patent No.: US 9,661,407 B2
(45) Date of Patent: May 23, 2017

(54) REDUCTION OF WAVELENGTH SELECTIVE SWITCH (WSS) FILTER-BASED IMPAIRMENT USING MULTI-CHANNEL FORWARD ERROR CORRECTION AVERAGING VIA INTERLEAVING

(71) Applicant: Infinera Corporation, Sunnyvale, CA (US)

(72) Inventor: Matthew L. Mitchell, Monte Sereno, CA (US)

(73) Assignee: Infinera Corporation, Sunnyvale, CA (US)

( * ) Notice: Subject to any disclaimer, the term of this patent is extended or adjusted under 35 U.S.C. 154(b) by 36 days.

(21) Appl. No.: 14/586,152

(22) Filed: Dec. 30, 2014

(65) Prior Publication Data

US 2016/0191203 A1    Jun. 30, 2016

(51) Int. Cl.
*H03M 13/00* (2006.01)
*H04Q 11/00* (2006.01)
(Continued)

(52) U.S. Cl.
CPC ......... *H04Q 11/0062* (2013.01); *H04B 10/00* (2013.01); *H04J 14/0212* (2013.01);
(Continued)

(58) Field of Classification Search
CPC ....... H04L 1/0041; H04L 12/18; H04L 1/004; H04L 1/0078; H04L 45/62; H04J 14/02;
(Continued)

(56) References Cited

U.S. PATENT DOCUMENTS

| 7,792,396 B2* | 9/2010 | Kish, Jr. ............... B82Y 20/00 |
| | | 324/762.03 |
| 2012/0082453 A1* | 4/2012 | Wu ...................... H04J 14/026 |
| | | 398/48 |

(Continued)

OTHER PUBLICATIONS

Sakamoto et al., Filter-less Multi-tone coherent orthogonal detection for multi-channel reception of super-channel/OFDM signals, Jun. 2013, OFC/NFOEC Technical Digset, pp. 1 to 12 (retrieved from Google.com May 2016).*

(Continued)

*Primary Examiner* — Shelly A Chase
(74) *Attorney, Agent, or Firm* — Harrity & Harrity LLP; David L. Soltz

(57) ABSTRACT

A method may include interleaving, by an optical device, a set of bits of a first channel with a set of bits of a second channel. The first channel may include first forward error correction (FEC) data associated with the set of bits of the first channel and the second channel may include second FEC data associated with the set of bits of the second channel. The method may further include transmitting first information via the first channel and second information via the second channel. The first information may include a portion of the set of bits of the first channel, a portion of the set of bits of the second channel, and the first FEC data. The second information may include another portion of the set of bits of the first channel, another portion of the set of bits of the second channel, and the second FEC data.

20 Claims, 28 Drawing Sheets

(51) Int. Cl.
*H04L 1/00* (2006.01)
*H04J 14/02* (2006.01)
*H04B 10/00* (2013.01)
*H03M 13/27* (2006.01)
*H03M 13/03* (2006.01)

(52) U.S. Cl.
CPC ...... *H04J 14/0221* (2013.01); *H04J 14/0278* (2013.01); *H04L 1/0002* (2013.01); *H04L 1/0041* (2013.01); *H04L 1/0071* (2013.01); *H04Q 11/0005* (2013.01); *H03M 13/03* (2013.01); *H03M 13/27* (2013.01); *H04L 2001/0096* (2013.01); *H04Q 2011/0016* (2013.01)

(58) Field of Classification Search
CPC .............. H04J 14/0278; H04J 14/0212; H04Q 11/0005; H04Q 2011/0016
See application file for complete search history.

(56) References Cited

U.S. PATENT DOCUMENTS

| | | | | |
|---|---|---|---|---|
| 2012/0301142 | A1* | 11/2012 | Huang | H04J 14/002 398/48 |
| 2013/0101292 | A1* | 4/2013 | Lanzone | H04J 3/1652 398/66 |
| 2013/0142510 | A1* | 6/2013 | Zhou | H04J 14/0208 398/48 |

OTHER PUBLICATIONS

Leoni et al., Impact of interleaving on SD-FEC operating in highly non-linear XPM limited regime, 2013, OFC/NFOEC Technical Digest,pp. 1 to 3 (retrived from Google.com May 2016).*
Wikipedia, "Forward error correction," http://en.wikipedia.org/wiki/Forward_error_correction, Sep. 25, 2014, 10 pages.

* cited by examiner

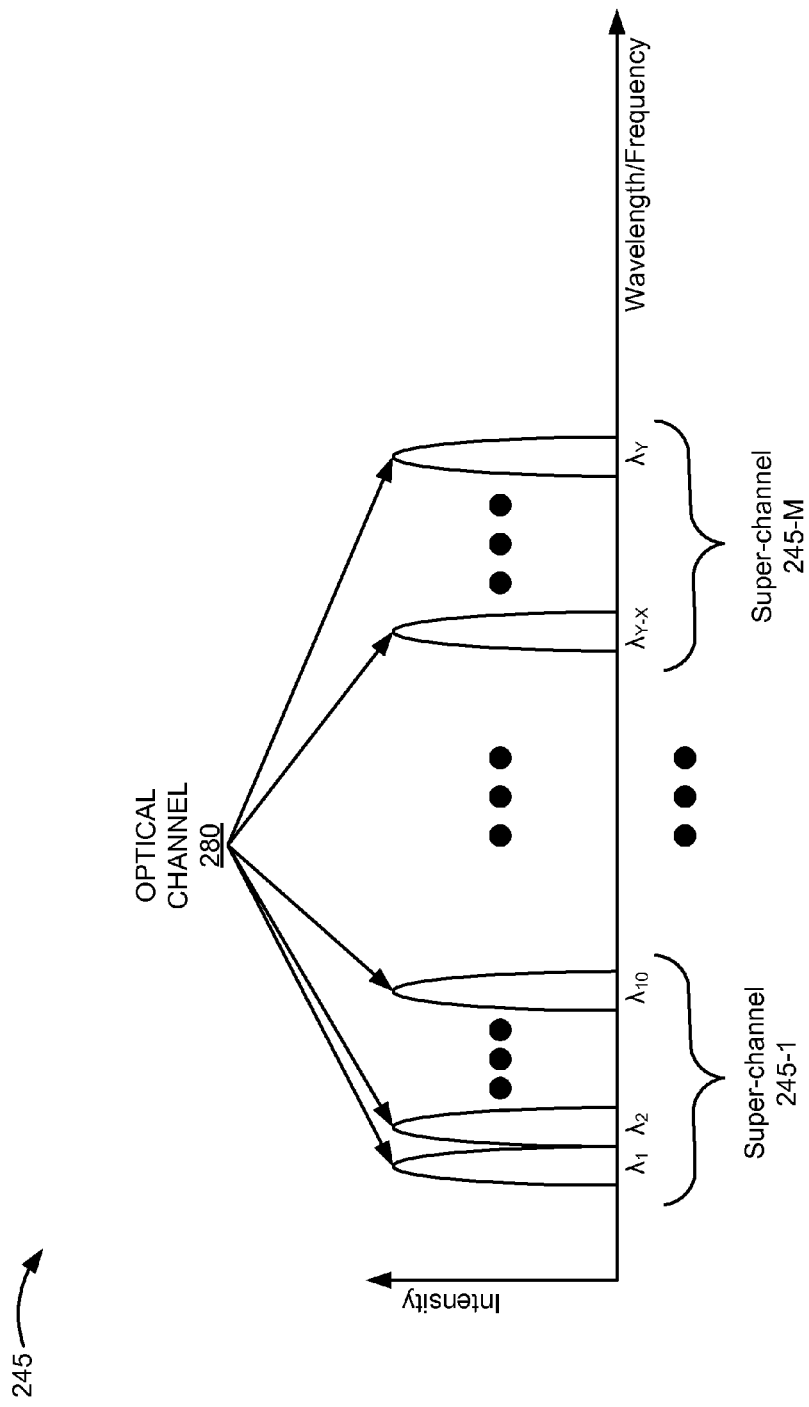

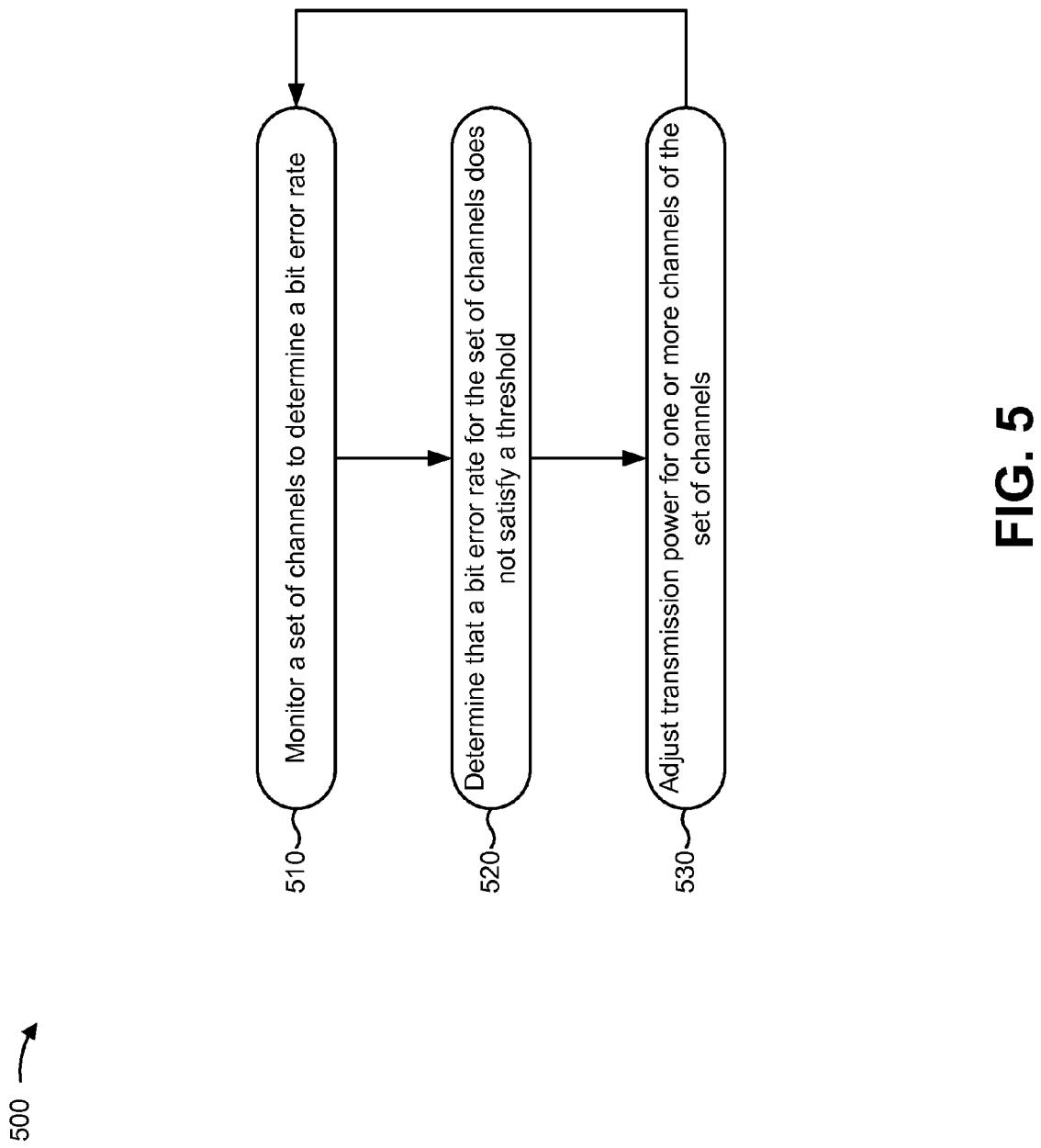

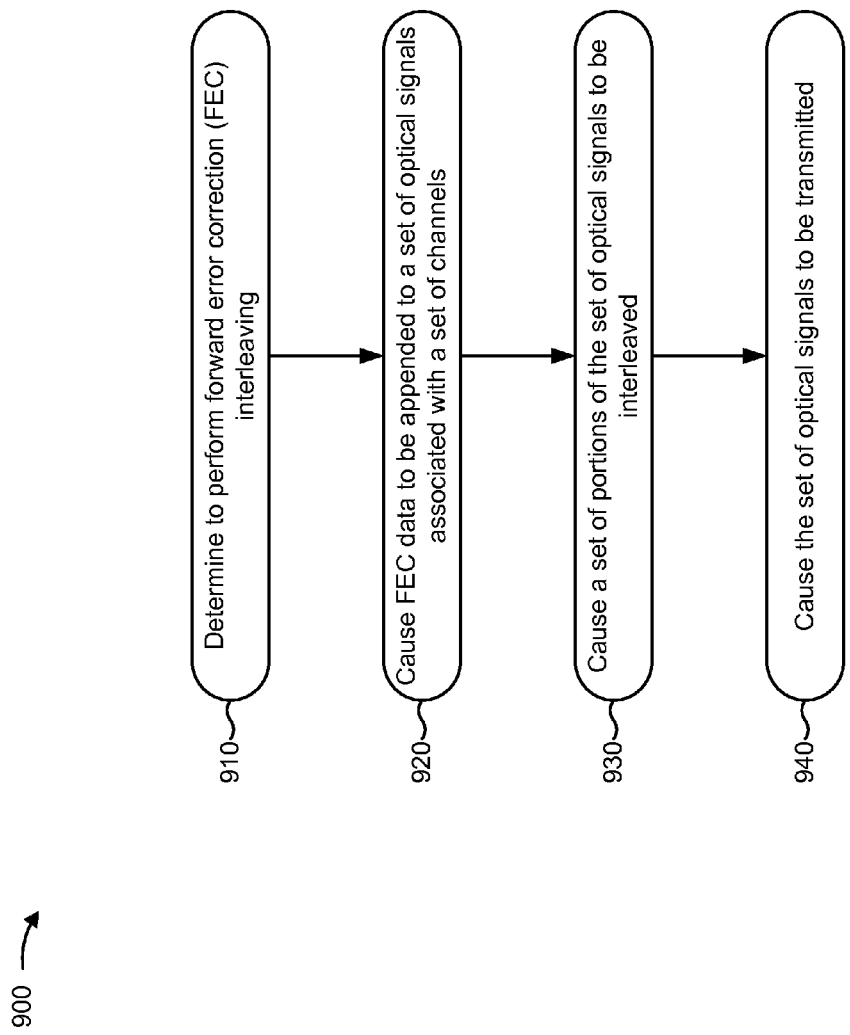

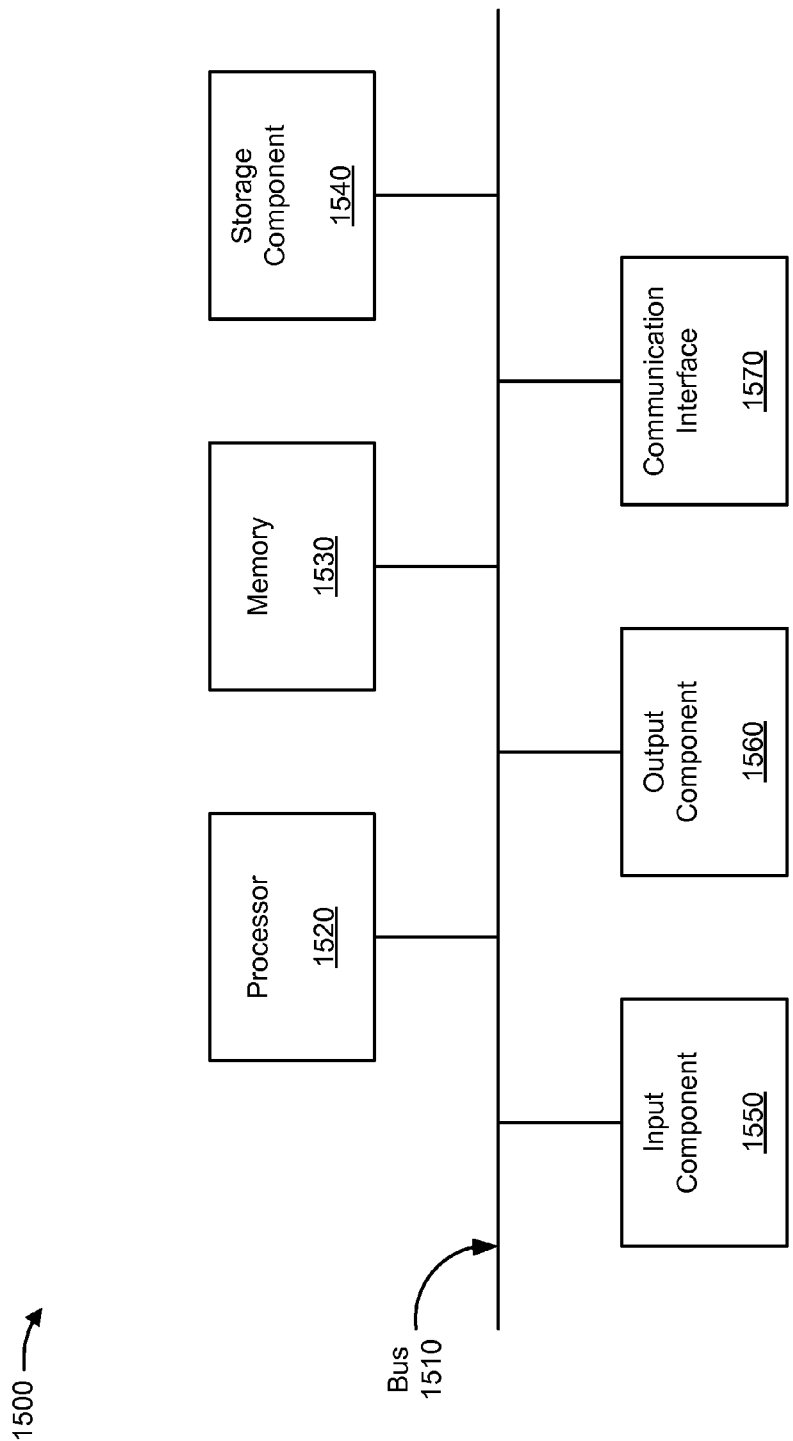

US 9,661,407 B2

REDUCTION OF WAVELENGTH SELECTIVE SWITCH (WSS) FILTER-BASED IMPAIRMENT USING MULTI-CHANNEL FORWARD ERROR CORRECTION AVERAGING VIA INTERLEAVING

BACKGROUND

Wavelength division multiplexed (WDM) optical communication systems (referred to as "WDM systems") are systems in which multiple optical signals, each having a different wavelength, are combined onto a single optical fiber using an optical multiplexer circuit (referred to as a "multiplexer"). Such systems may include a transmitter circuit, such as a transmitter (Tx) photonic integrated circuit (PIC) having a transmitter component to provide a laser associated with each wavelength, a modulator configured to modulate the output of the laser, and a multiplexer to combine each of the modulated outputs (e.g., to form a combined output or WDM signal), which may be collectively integrated onto a common semiconductor substrate.

A WDM system may also include a receiver circuit, such as a receiver (Rx) PIC, having a photodiode, and an optical demultiplexer circuit (referred to as a "demultiplexer") configured to receive the combined output and demultiplex the combined output into individual optical signals.

A WDM system may also include a set of nodes (e.g., devices of the WDM system that may be utilized to route the multiple optical signals, add another optical signal to the multiple optical signals, drop an optical signal from the multiple optical signals, or the like). For example, the WDM system may include a set of reconfigurable optical add-drop multiplexers (ROADMs).

A wavelength of an optical signal output from the Tx PIC may be utilized to transmit information at a fixed data rate. However, multiple optical signals may be combined into a unified channel that facilitates transmission of information at a higher data rate. The multiple optical signals may be combined into one or more super-channels for routing through a network.

SUMMARY

According to some possible implementations, a method may include interleaving, by an optical device, a set of bits of a first channel with a set of bits of a second channel. The first channel may include first forward error correction (FEC) data associated with the set of bits of the first channel and the second channel may include second FEC data associated with the set of bits of the second channel. The method may further include transmitting first information via the first channel and second information via the second channel. The first information may include a portion of the set of bits of the first channel, a portion of the set of bits of the second channel, and the first FEC data. The second information may include another portion of the set of bits of the first channel, another portion of the set of bits of the second channel, and the second FEC data.

According to some possible implementations, one or more optical devices may generate first forward error correction information associated with a first channel and second forward error correction information associated with a second channel. The one or more optical devices may interleave first portions of bits associated with the first channel and second portions of bits associated with the second channel. The first channel and the second channel may be associated with a super-channel. The one or more optical devices may transmit one or more optical signals associated with the first channel and the second channel based on interleaving the first portions of bits and the second portions of bits. The one or more optical devices may de-interleave the first portions of bits and the second portions of bits after transmitting the one or more optical signals. The one or more optical devices may recover information transmitted via the first channel and the second channel based on de-interleaving the first portions of bits and the second portions of bits and based on the first forward error correction information and the second forward error correction information.

According to some possible implementations, one or more optical devices may interleave a first set of portions of a first set of optical signals with a second set of portions of a second set of optical signals. The first set of portions may be associated with first forward error correction information associated with recovering the first set of portions when the first set of optical signals is attenuated by a filter. The second set of portions may be associated with second forward error correction information associated with recovering the second set of portions when the second set of optical signals is attenuated by the filter. The first set of optical signals may be associated with a first channel of a super-channel and the second set of optical signals may be associated with a second channel of the super-channel. The one or more optical devices may transmit the first set of portions and the second set of portions.

BRIEF DESCRIPTION OF THE DRAWINGS

FIGS. 2A-2E are diagrams of an example network in which systems and/or methods, described herein, may be implemented;

FIG. 5 is a flow chart of an example process for reducing wavelength selective switch (WSS) filter-based impairment using comparative channel pre-emphasis.

FIGS. 9A and 9B are flow charts of an example process for reducing WSS filter-based impairment using multi-channel forward error correction averaging via an interleaving process;

FIG. 15 is a diagram of example components of one or more devices described herein.

DETAILED DESCRIPTION

Figure 1:
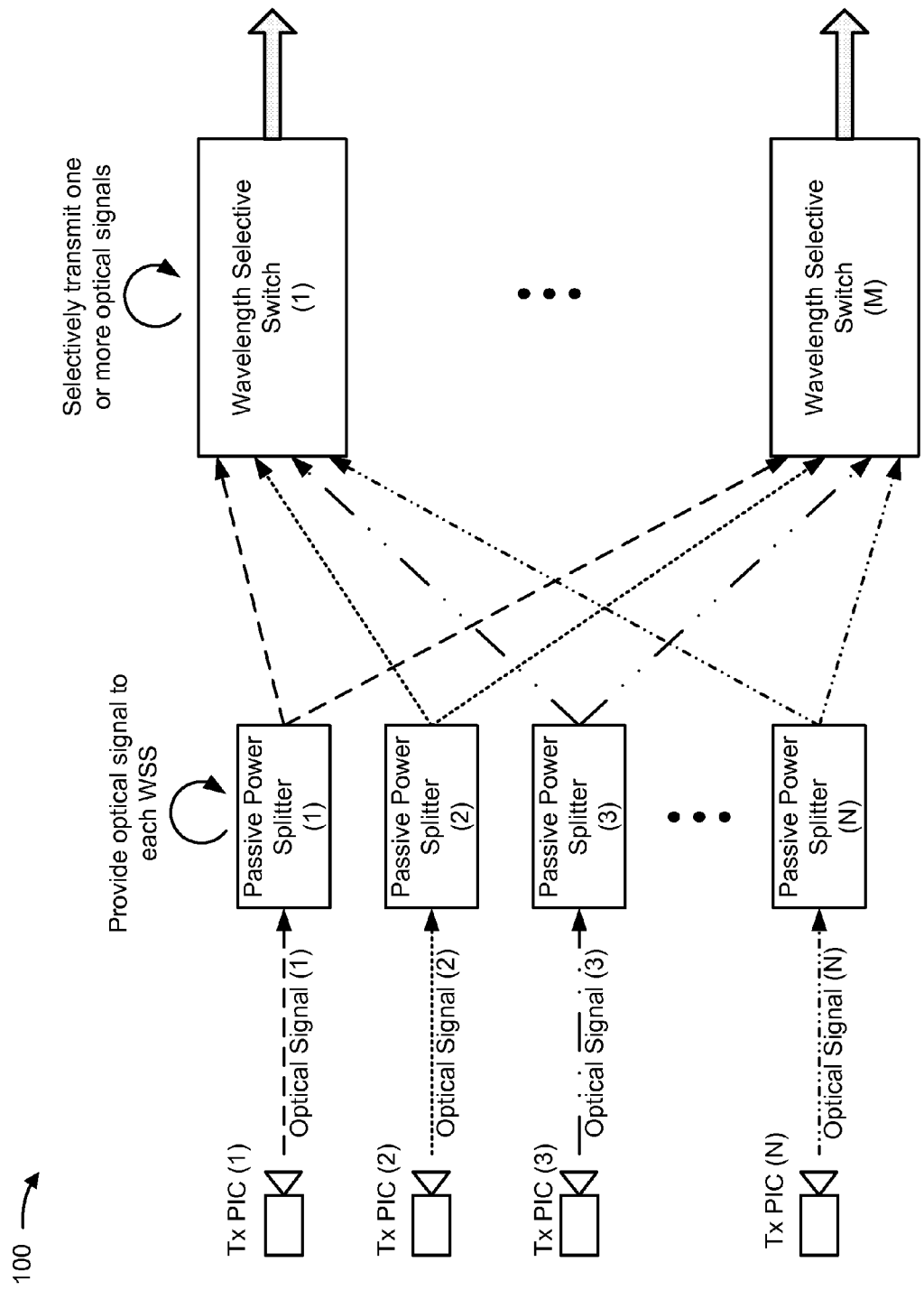
FIG. 1 is a diagram of an overview of an example implementation described herein.

The following detailed description of example implementations refers to the accompanying drawings. The same reference numbers in different drawings may identify the same or similar elements.

An optical transmitter associated with a wavelength division multiplexed (WDM) optical communication system may transmit multiple optical signals via a single optical communication path using an optical multiplexer circuit. The optical transmitter may transmit one or more super-channels that include the multiple optical signals to a receive node, which may include an optical receiver, of a network. Multiple optical transmitters may be associated with a single transmit node and may transmit multiple super-channels for routing to multiple receive nodes.

A node may be referred to as "colorless" if ports of the node lack a fixed wavelength assignment. In other words, tunable transmitters/receivers have wavelength transparent access to any port of the multiplexing architecture. The node may be termed "directionless" if channels transmitted by the transmitter lack a fixed routing assignment (e.g., a first transmitter is configured to transmit to any of a set of reconfigurable optical add-drop multiplexers (ROADMs) sharing optical links with the node, a second transmitter is configured to transmit to any of the set of ROADMs sharing optical links with the node, etc.). In other words, transmitters/receivers of the node have non-blocking access to ROADM output via the multiplexing architecture. The node may be termed "contentionless" if multiple ports of the multiplexing function may utilize the same wavelength. In other words, two or more transmitters/receivers of the multiplexer may transmit/receive optical signals utilizing the same wavelength (e.g., to carry the same information, to carry different information, or the like) to/from two or more ports.

Utilizing a set of optical switches to facilitate routing multiple super-channels to multiple nodes may require expensive equipment and may lack the flexibility to handle changes to the network. Implementations, described herein, may utilize a set of passive splitters and wavelength selective switches (WSSs) to provide a colorless, directionless, and contentionless (CDC) broadcast multiplexing architecture.

A ROADM may include a WSS to allow a routing function for various portions of the optical spectrum, such as to another ROADM. The WSS may support local addition of channels (add) and/or local dropping of channels (drop). The WSS may utilize routing to drop channels and an addition and blocking functionality to add channels. For example, when adding channels, a particular WSS filter pass-band may permit a particular set of wavelengths to pass (add) without attenuation, and the particular filter may attenuate other wavelengths present on an add port which are not desired. The use of a pass-band may impose a penalty on the passed channels, such as because of a non-ideal shape of the pass-band, an undesired optical feature of the pass-band, or the like. The penalty may be an impairment of a portion of the passed channels, such as an impairment of an edge channel. An impaired optical signal may incur bit errors during transmission (e.g., a quantity of bits of the optical signal that are not received, that are not received correctly, or the like). A bit error rate above a threshold may result in an unacceptable quantity of information being lost from the optical signal. Similarly, another threshold performance metric may result indicate an inadequate signal that may be corrected by an impairment reduction technique, such as an optical performance monitor metric, a channel power, an optical signal-to-noise ratio, or the like. A pass-band filter may attenuate a first channel associated with a first set of wavelengths more than a second channel associated with a second set of wavelengths, resulting in different bit error rates for the first channel and the second channel of a super-channel. Concentrating bit errors in a particular channel of a set of channels may result in degraded network performance. Implementations, described herein, may utilize a set of techniques to reduce the impact of WSS filter-based impairment. In some implementations, the set of techniques may reduce a bit error rate, reduce a differential between a first bit error rate of a first channel and a second bit error rate of a second channel, or the like.

FIG. 1 is a diagram of an overview of an example implementation 100 described herein. As shown in FIG. 1, a node (e.g., a ROADM) may include a set of transmitter (Tx) photonic integrated circuits (PICs) (e.g., Tx PICs (1) through (N)) that may transmit a corresponding set of optical signals (e.g., optical signals (1) through (N)). Each optical signal may include one or more super-channels. Each super-channel may be comprised of a set of channels and each channel may be comprised of a set of subcarriers. A set of passive power splitters (e.g., passive power splitters (1) through (N)) corresponding to the set of Tx PICs may receive the set of optical signals. For example, passive power splitter (1) may receive optical signal (1) from Tx PIC (1). Similarly, passive power splitter (N) may receive optical signal (N) from Tx PIC (N). A particular passive power splitter may power-split a particular optical signal received from a particular Tx PIC into a particular quantity of power-split portions for routing to a set of WSSs. For example, when m WSSs are associated with passive power splitter (1), passive power splitter (1) may power-split optical signal (1) into m power-split portions (e.g., each power split portion resembling optical signal (1) but having approximately one mth of the power of optical signal (1)). Similarly, passive power splitter (N) may power-split optical signal (N) into m power-split portions.

As further shown in FIG. 1, the particular power splitter may transmit the set of power-split portions to the set of WSSs. For example, passive power splitter (1) may provide a first one-mth power-split portion to WSS (1), a second one-mth power-split portion to WSS (2), etc. A WSS may utilize a set of filters to selectively route optical signals received from the set of passive power splitters to a set of other ROADMS (e.g., other nodes of an optical network). For example, WSS (1) may route a received one-mth power-split portion of optical signal (1) toward a receiver associated with another ROADM. Additionally, or alternatively, a particular WSS may route multiple received optical signals. Additionally or alternatively, a particular optical signal may be routed to multiple receive nodes via multiple WSSs.

In this way, a set of passive power splitters connected to a set of WSSs associated may facilitate CDC broadcast multiplexing.

Figure 2A:
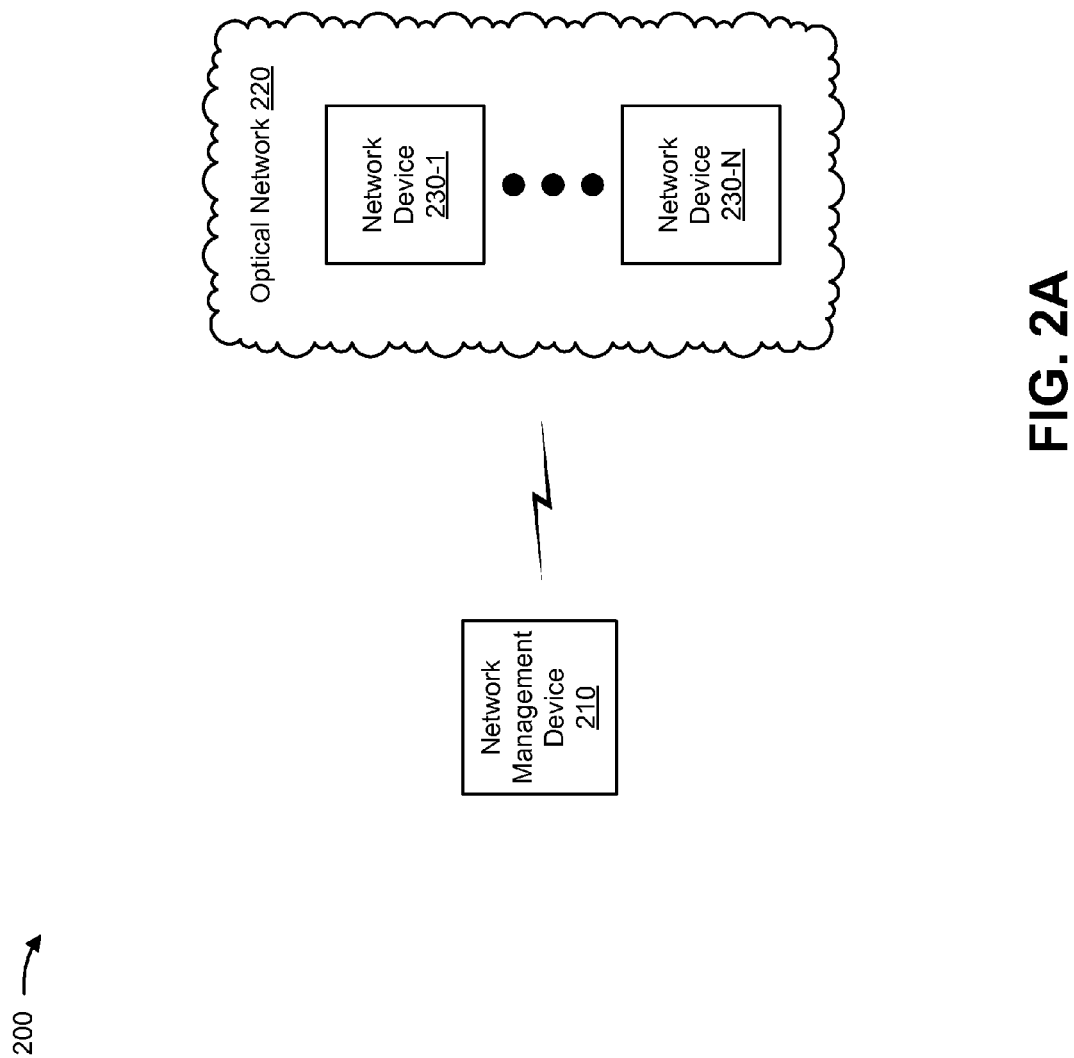

FIGS. 2A-2E are diagrams of an example environment 200 in which systems and/or methods, described herein, may be implemented. As shown in FIG. 2A, environment 200 may include a network management device 210, and an optical network 220, which may include a set of network devices 230-1 through 230-N (N≥1) (hereinafter referred to individually as "network device 230," and collectively as "network devices 230"). Devices of environment 200 may interconnect via wired connections, wireless connections, or a combination of wired and wireless connections.

Network management device 210 may include one or more devices capable of receiving, generating, storing, processing, and/or providing information associated with a network (e.g., optical network 220). For example, network management device 210 may include a computing device, such as a server, a controller, an optical performance monitor device, or a similar type of device. Network management device 210 may assist a user in modeling, planning, and/or controlling a network, such as optical network 220. For example, network management device 210 may assist in modeling and/or planning an optical network configuration, which may include quantities, locations, capacities, parameters, and/or configurations of network devices 230. In some implementations, network management device 210 may cause a technique for reducing WSS filter-based-impairment to be applied to one or more network devices 230. In some implementations, network management device 210 may cause one or more optical signals to be routed via optical network 220. In some implementations, network management device 210 may be a distributed device associated with one or more network devices 230. In some implementations, network management device 210 may be a component of network device 230 (e.g., a controller, a transmitter, a receiver, or the like). In some implementations, network management device 210 may be implemented as a processor, a microprocessor, an application-specific integrated circuit (ASIC), a field-programmable gate array (FPGA), or the like. In some implementations, network management device 210 may refer to one or more testing, simulation, and/or configuration devices associated with designing or operating an optical network 220.

Optical network 220 may include any type of network that uses light as a transmission medium. For example, optical network 220 may include a fiber-optic based network, an optical transport network, a light-emitting diode network, a laser diode network, an infrared network, and/or a combination of these or other types of optical networks. Optical network 220 may include one or more optical routes (e.g., optical lightpaths) that may specify a route along which light is carried (e.g., using one or more optical links) between two or more network devices 230 (e.g., via an optical link). An optical link may include an optical fiber, an optical control channel, an optical data channel, or the like, and may carry an optical channel (e.g., a signal associated with a particular wavelength of light that may include a set of optical subcarriers that subdivide the optical channel), an optical super-channel (e.g., a set of optical signals), a super-channel set, an optical carrier set, a set of spectral slices, or the like.

Network device 230 may include one or more devices capable of receiving, generating, storing, processing, and/or providing data carried by an optical signal via an optical link. For example, network device 230 may include one or more optical data processing and/or optical traffic transfer devices, such as an optical amplifier (e.g., a doped fiber amplifier, an erbium doped fiber amplifier, a Raman amplifier, etc.), an optical add-drop multiplexer (OADM) (e.g., a reconfigurable optical add-drop multiplexer (ROADM), a flexibly reconfigurable optical add-drop multiplexer (FROADM), etc.), an optical source device (e.g., a laser source), an optical destination device (e.g., a laser sink), an optical multiplexer, an optical demultiplexer, an optical transmitter, an optical receiver, an optical transceiver, a photonic integrated circuit (PIC), an integrated optical circuit, a wavelength selective switch (WSS), a power splitter (e.g., a passive power splitter, an active power splitter, or the like), a power combiner, or the like. In some implementations, network device 230 may include one or more optical components. Network device 230 may process and/or transmit an optical signal (e.g., to another network device 230 via an optical link) to deliver the optical signal through optical network 220.

The number and arrangement of devices and networks shown in FIG. 2A are provided as an example. In practice, there may be additional devices and/or networks, fewer devices and/or networks, different devices and/or networks, or differently arranged devices and/or networks than those shown in FIG. 2A. Furthermore, two or more devices shown in FIG. 2A may be implemented within a single device, or a single device shown in FIG. 2A may be implemented as multiple, distributed devices. Additionally, or alternatively, a set of devices (e.g., one or more devices) of environment 200 may perform one or more functions described as being performed by another set of devices of environment 200.

Figure 2B:
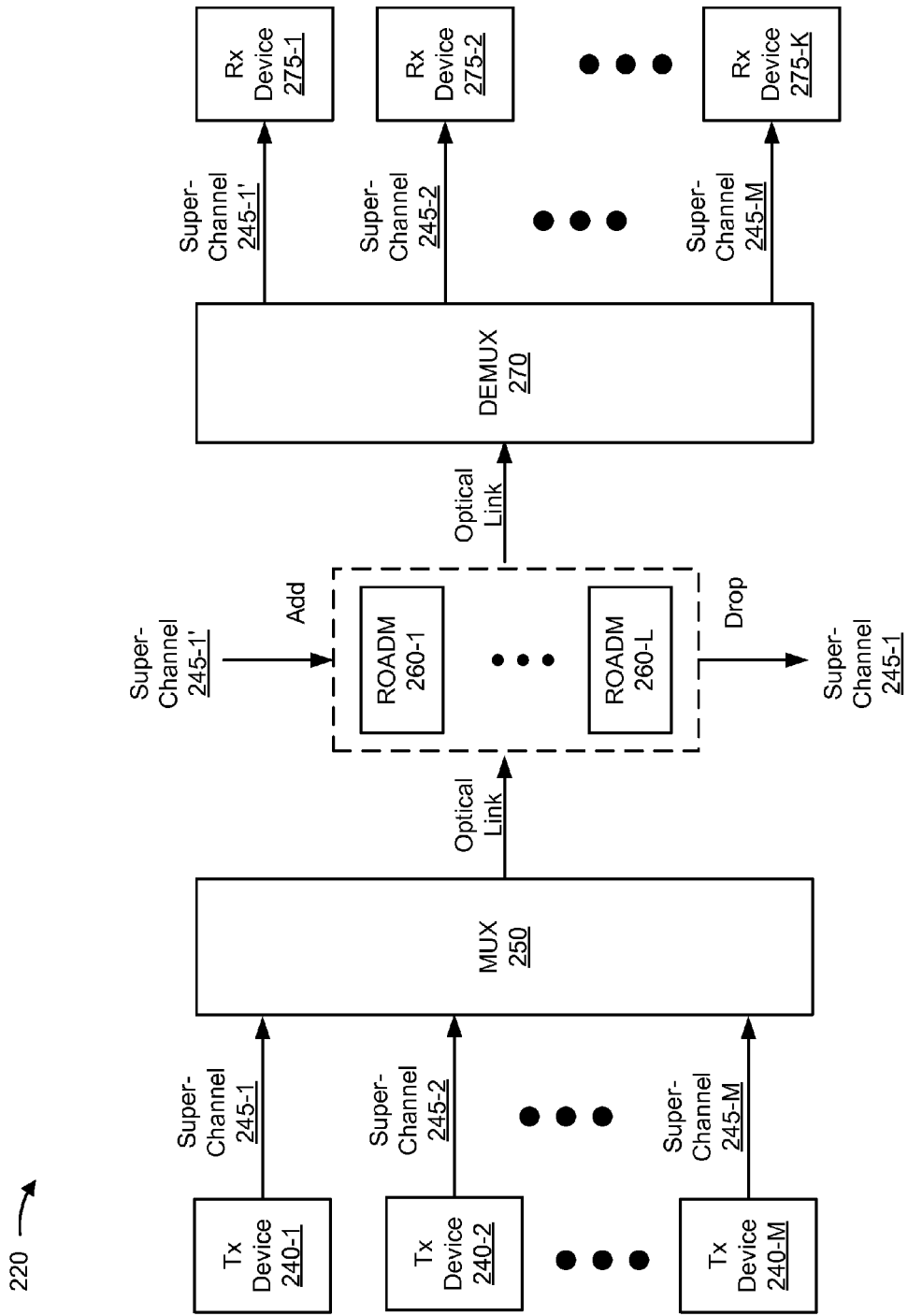

FIG. 2B is a diagram of example devices of optical network 220 that may be designed, monitored, and/or configured according to implementations described herein. One or more devices shown in FIG. 2B may operate within optical network 220, and may correspond to one or more network devices 230 and/or one or more optical components of a network device 230. As shown, optical network 220 may include a set of optical transmitter devices 240-1 through 240-M (M≥1) (hereinafter referred to individually as "Tx device 240," and collectively as "Tx devices 240"), a set of super-channels 245-1 through 245-M (M≥1) (hereinafter referred to individually as "super-channel 245," and collectively as "super-channels 245"), a multiplexer ("MUX") 250, a set of ROADMs 260-1 through 260-L (L≥1) (hereinafter referred to individually as "ROADM 260," and collectively as "ROADMs 260"), a demultiplexer ("DEMUX") 270, and one or more optical receiver devices 275-1 through 275-K (K≥1) (hereinafter referred to individually as "Rx device 275," and collectively as "Rx devices 275").

Tx device 240 may include, for example, an optical transmitter and/or an optical transceiver that generates an optical signal. For example, Tx device 240 may include one or more integrated circuits, such as a transmitter photonic integrated circuit (PIC), an application specific integrated circuit (ASIC), or the like. In some implementations, Tx device 240 may include a laser associated with each wavelength, a digital signal processor to process digital signals, a digital-to-analog converter to convert the digital signals to analog signals, a modulator to modulate the output of the laser, and/or a multiplexer to combine each of the modulated outputs (e.g., to form a combined output or WDM signal). One or more optical signals may be carried as super-channel 245. In some implementations, a single Tx device 240 may be associated with a single super-channel 245. In some implementations, a single Tx device 240 may be associated with multiple super-channels 245, or multiple Tx devices 240 may be associated with a single super-channel 245. In some implementations, Tx device 240 may include a forward error correction (FEC) encoder, a FEC interleaver, or the like. In some implementations, Tx device 240 may correspond to and/or include one or more components described herein with regards to FIG. 6A, FIG. 8A, FIG. 10A, FIG. 12A, and/or FIG. 14A.

Super-channel 245 may include multiple channels (e.g., optical signals) multiplexed together using wavelength-division multiplexing to increase transmission capacity. Various quantities of channels may be combined into super-channels using various modulation formats to create different super-channel types having different characteristics. Various quantities of subcarriers may be combined into channels using various modulation formats. In some implementations, an optical link may include a super-channel set. A super-channel set may include multiple super-channels multiplexed together using wavelength-division multiplexing to increase transmission capacity. Examples of super-channels 245 will be described herein with respect to FIG. 2C.

Multiplexer 250 may include, for example, an optical multiplexer (e.g., a power multiplexer, a WSS-based multiplexer, a multi-cast multiplexer, or the like) that combines multiple input super-channels 245 for transmission via an output fiber). For example, multiplexer 250 may combine super-channels 245-1 through 245-M, and may provide the combined super-channels 245 to ROADM 260 via an optical link (e.g., a fiber).

ROADM 260 may include, for example, an OADM, a ROADM, a FROADM, or the like. ROADM 260 may multiplex, de-multiplex, add, drop, and/or route multiple super-channels 245 into and/or out of a fiber (e.g., a single mode fiber). As illustrated, a particular ROADM 260, of the set of ROADMs 260, may drop super-channel 245-1 from a fiber, and may allow super-channels 245-2 through 245-M to continue propagating toward Rx device 275 and/or another ROADM 260. Dropped super-channel 245-1 may be provided to a device (not shown) that may demodulate and/or otherwise process super-channel 245-1 to output the data stream carried by super-channel 245-1. As further shown, ROADM 260 may add super-channel 245-1' to the fiber. Super-channel 245-1' and super-channels 245-2 through 245-M may propagate to demultiplexer 270 and/or another ROADM 260. A network including multiple ROADMs 260 is described in more detail herein in connection with FIG. 2D and FIG. 2E.

Demultiplexer 270 may include, for example, an optical de-multiplexer (e.g., a power demultiplexer, a WSS-based demultiplexer, or the like) that separates multiple super-channels 245 carried over an input fiber. For example, demultiplexer 270 may separate super-channels 245-1' and super-channels 245-2 through 245-M, and may provide each super-channel 245 to a corresponding Rx device 275.

Rx device 275 may include, for example, an optical receiver and/or an optical transceiver that receives an optical signal. For example, Rx device 275 may include one or more integrated circuits, such as a receiver PIC, an ASIC, or the like. In some implementations, Rx device 275 may include a demultiplexer to receive combined output and demultiplex the combined output into individual optical signals, a photodetector to convert an optical signal to a voltage signal, an analog-to-digital converter to convert voltage signals to digital signals, and/or a digital signal processor to process the digital signals. One or more optical signals may be received by Rx device 275 via super-channel 245. Rx device 275 may convert a super-channel 245 into one or more electrical signals, which may be processed to output information associated with each data stream carried by an optical channel included in super-channel 245. In some implementations, a single Rx device 275 may be associated with a single super-channel 245. In some implementations, a single Rx device 275 may be associated with multiple super-channels 245, or multiple Rx devices 275 may be associated with a single super-channel 245. In some implementations, Rx device 275 may include a FEC decoder, a FEC de-interleaver, or the like.

One or more devices shown in FIG. 2B may correspond to a single network device 230. In some implementations, a combination of devices shown in FIG. 2B correspond to a single network device 230. For example, Tx devices 240-1 through 240-M and multiplexer 250 may correspond to a single network device 230. As another example, Rx devices 275-1 through 275-K and demultiplexer 270 may correspond to a single network device 230.

The number and arrangement of devices shown in FIG. 2B are provided as an example. In practice, there may be additional devices, fewer devices, different devices, or differently arranged devices, included in optical network 220, than those shown in FIG. 2B. Furthermore, two or more devices shown in FIG. 2B may be implemented within a single device, or a single device shown in FIG. 2B may be implemented as multiple, distributed devices. Additionally, or alternatively, a set of devices shown in FIG. 2B may perform one or more functions described as being performed by another set of devices shown in FIG. 2B.

FIG. 2C is a diagram of example super-channels 245 that may be monitored and/or configured according to implementations described herein. A super-channel, as used herein, may refer to multiple optical channels that are simultaneously transported over the same optical waveguide (e.g., a single mode optical fiber). Each optical channel included in a super-channel may be associated with a particular optical wavelength (or set of optical wavelengths). Each optical channel included in a super-channel may be associated with multiple subcarriers. Each subcarrier may be associated with a particular optical wavelength. The multiple optical channels may be combined to create a super-channel using wavelength division multiplexing. In some implementations, each optical channel may be modulated to carry an optical signal.

An example frequency and/or wavelength spectrum associated with super-channels 245 is illustrated in FIG. 2C. In some implementations, the frequency and/or wavelength spectrum may be associated with a particular optical spectrum (e.g., C Band, C+ Band, etc.). As illustrated, super-channel 245-1 may include multiple optical channels 280, each of which corresponds to a wavelength λ (e.g., λ1, λ2, through λ10) within a first wavelength band. Similarly, super-channel 245-M may include multiple optical channels 280, each of which corresponds to a wavelength λ (e.g., λY-X through λY) within a second wavelength band. The quantity of illustrated optical channels 280 per super-channel 245 is provided for explanatory purposes. In practice, super-channel 245 may include any quantity of optical channels 280.

Optical channel 280 may be associated with a particular frequency and/or wavelength of light. In some implementations, optical channel 280 may be associated with a frequency and/or wavelength at which the intensity of light carried by optical channel 280 is strongest (e.g., a peak intensity, illustrated by the peaks on each optical channel 280). In some implementations, optical channel 280 may be associated with a set of frequencies and/or a set of wavelengths centered at a central frequency and/or wavelength. The intensity of light at the frequencies and/or wavelengths around the central frequency and/or wavelength may be weaker than the intensity of light at the central frequency and/or wavelength, as illustrated.

In some implementations, the spacing between adjacent wavelengths (e.g., λ1 and λ2) may be equal to or substantially equal to a bandwidth (or bit rate) associated with a data stream carried by optical channel 280. For example, assume each optical channel 280 included in super-channel 245-1 (e.g., λ1 through λ10) is associated with a 50 Gigabit per second ("Gbps") data stream. In this example, super-channel 265-1 may have a collective data rate of 500 Gbps (e.g., 50 Gbps×10). In some implementations, the collective data rate of super-channel 245 may be greater than or equal to 100 Gbps. Additionally, or alternatively, the spacing between adjacent wavelengths may be non-uniform, and may vary within a particular super-channel band (e.g., super-channel 245-1). In some implementations, optical channels 280 included in super-channel 245 may be non-adjacent (e.g., may be associated with non-adjacent wavelengths in an optical spectrum).

Each super-channel 245 may be provisioned in optical network 220 as one optical channel and/or as an individual optical channel. Provisioning of an optical channel may include designating a route for the optical channel through optical network 220. For example, an optical channel may be provisioned to be transmitted via a set of network devices 230. Provisioning may be referred to as "allocating" and/or "allocation" herein.

Figure 2D:
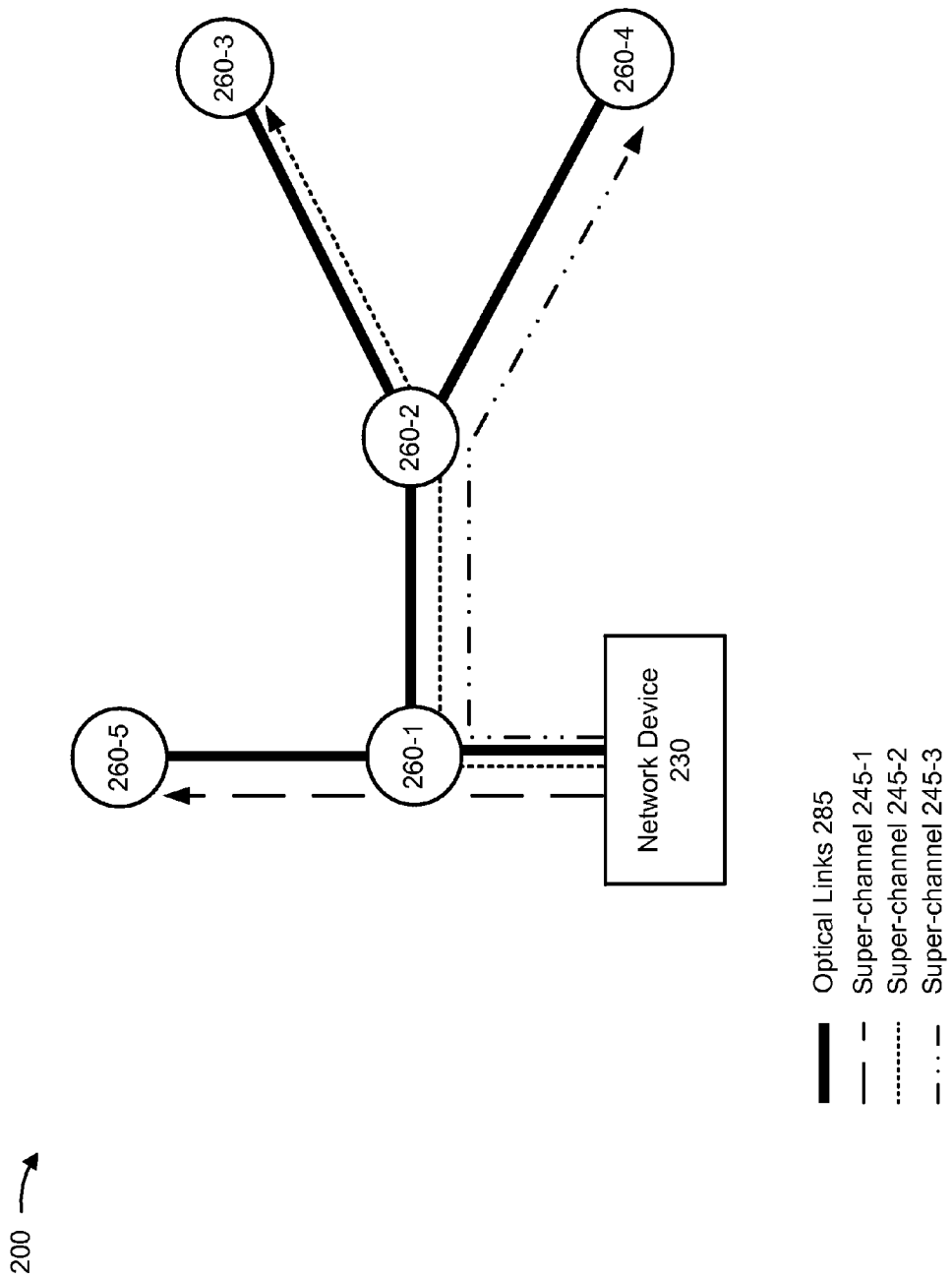

As shown in FIG. 2D, optical network 220 may include a set of ROADMs 260-1 through 260-5 (e.g., nodes of optical network 220) that may facilitate communication via optical network 220. Network device 230 (e.g., Tx device 240, Rx device 275, or the like) may output/receive a set of super-channels 245 to/from ROADM 260-1 via optical link 285 (e.g., an optical fiber). ROADM 260-1 may be connected via a first optical link 285 to ROADM 260-2 and via a second optical link 285 to ROADM 260-5. Furthermore, for example, ROADM 260-2 may be connected via a first optical link 285 to ROADM 260-3 and via a second optical link 285 to ROADM 260-4. The set of super-channels 245 may include a set of individually routable super-channels 245-1 through 245-3. In some implementations, ROADM 260 may perform first node routing. For example, when ROADM 260 is as a first node of optical network 220 that receives the set of super-channels 245 from a source of the set of super-channels 245, ROADM 260 may route the set of super-channels 245 to different ROADMs 260. In other words, a particular ROADM 260 that receives the individual super-channels 245 from a source of the individual super-channels 245 (e.g., Tx device 240), performs routing for the individual super-channels 245 to a set of other ROADMs 260. For example, ROADM 260-1 may receive super-channel 245-1 from network device 230 (e.g., Tx device 240) and may route super-channel 245-1 to ROADM 260-5 and may receive super-channel 245-2 from network device 230 (e.g., Tx device 240) and may route super-channel 245-2 to ROADM 260-2. In some implementations, ROADM 260-1 may perform first node routing using a set of WSSs, a set of passive power-splitters, a set of passive power-combiners, or the like, configured to independently route one or more super-channels 245 of a set of super-channel 245, as described herein in connection with FIGS. 3A-3B and FIG. 4.

Figure 2E:
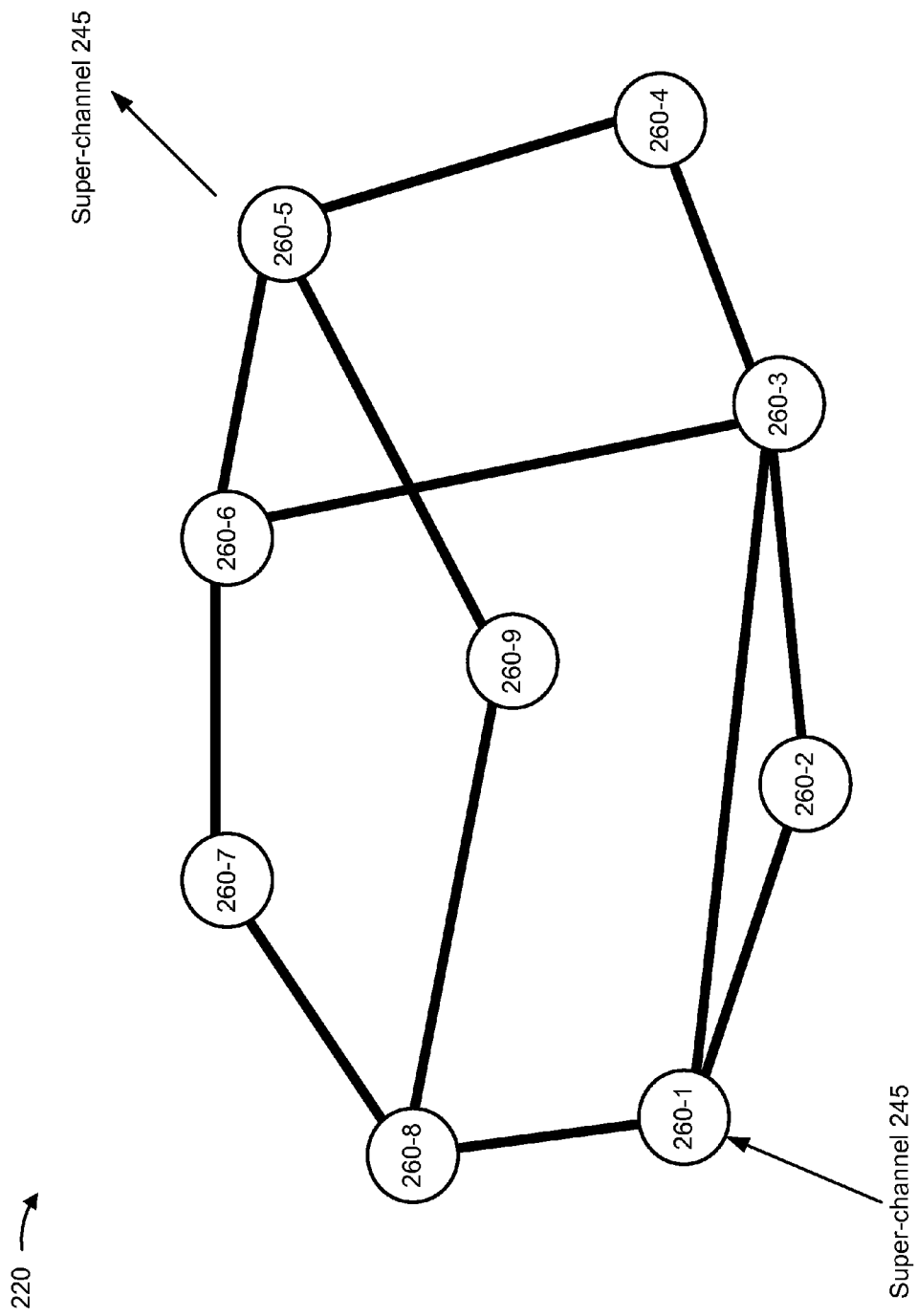

As shown in FIG. 2E, optical network 220 may include a network configuration utilizing multiple ROADMs 260 (e.g., nodes of optical network 220) to route super-channel 245 from a source of super-channel 245 to a destination for super-channel 245. For example, ROADM 260-1 may receive super-channel 245 and may route super-channel 245 via ROADM 260-2, ROADM 260-3, and ROADM 260-4 to ROADM 260-5. Additionally, or alternatively, ROADM 260-1 may route super-channel 245 via ROADM 260-8 and ROADM 260-9 to ROADM 260-5. In some implementations, ROADM 260-1 may select a routing path for super-channel 245 based on a distance associated with the routing path, a quantity of nodes traversed via the routing path, a wavelength availability associated with the routing path, or the like. FIG. 2E is provided as an example of optical network 220. Optical network 220 may include a different quantity of ROADMs 260, a different set of paths connecting a set of ROADMs 260, a different set of network devices 230, or the like.

Figure 3A:
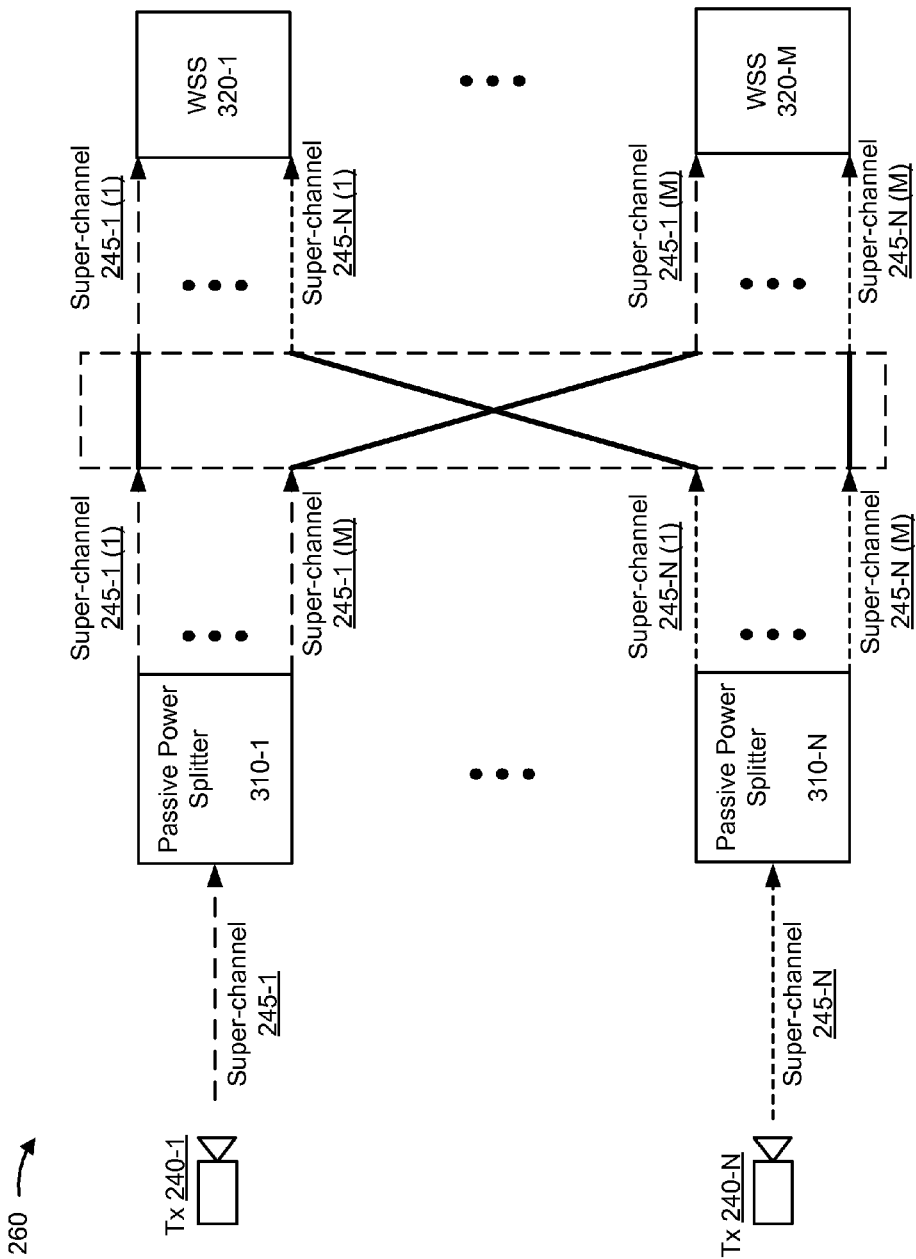
FIGS. 3A and 3B are diagrams of example components of a reconfigurable optical add-drop multiplexer shown in FIGS. 2A-2E, that may facilitate routing of a super-channel.
Figure 3B:
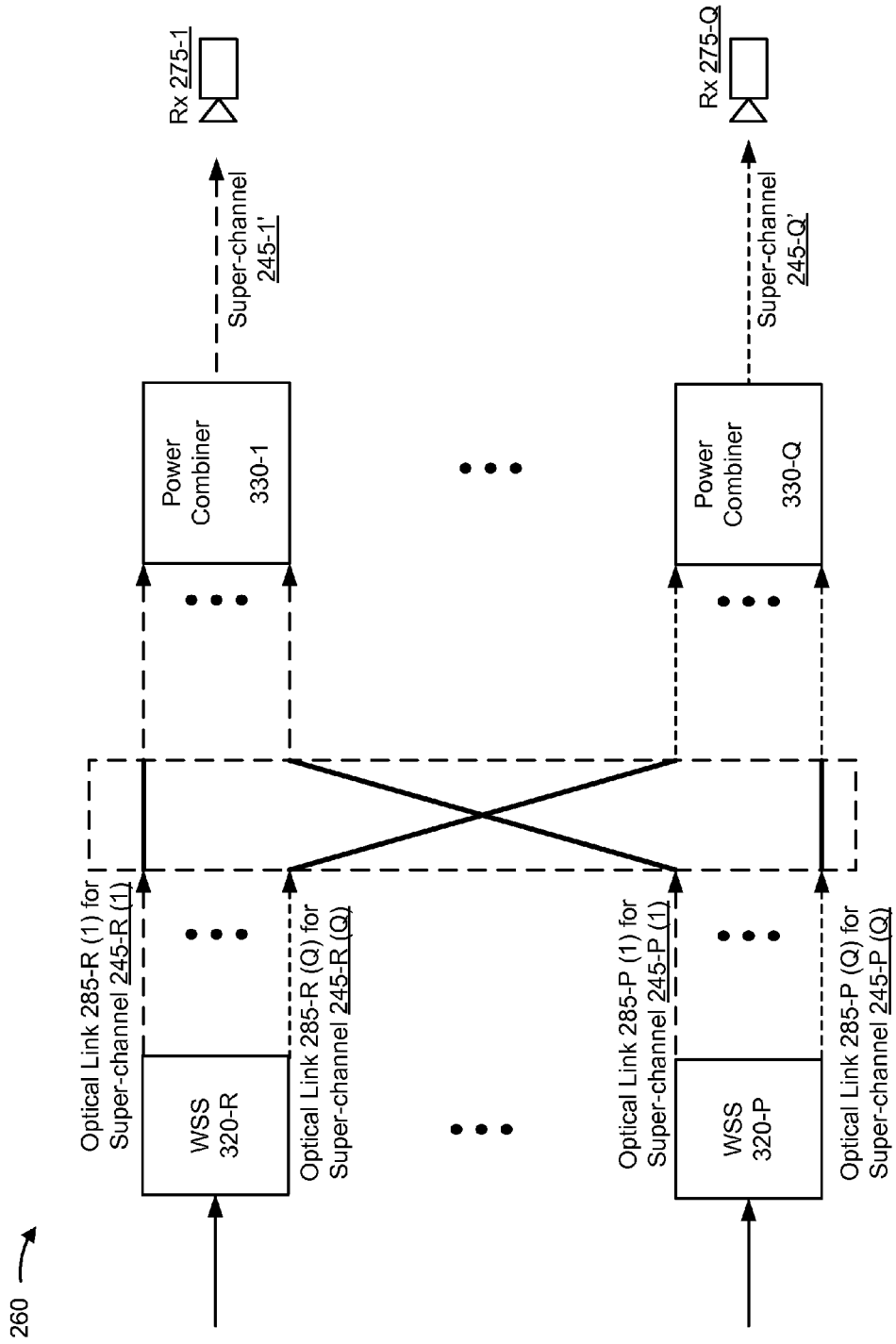

FIGS. 3A and 3B are diagrams of components of ROADM 260 shown in optical network 220 of FIG. 2B. As shown in FIG. 3A, ROADM 260 may include a set of Tx devices 240-1 through 240-N (N≥1), a set of passive power splitters 310-1 through 310-N (N≥1) (hereinafter referred to individually as "passive power splitter 310," and collectively as "passive power splitters 310"), and a set of wavelength selective switches (WSSs) 320-1 through 320-M (M≥1) (hereinafter referred to individually as "WSS 320," and collectively as "WSS 320").

Passive power splitter 310 may include, for example, a power splitter that is configured to receive an optical signal and route a set of power-split portions of the optical signal to a set of other network devices 230 (e.g., a set of WSSs 320). In some implementations, passive power splitter 310 may generate a quantity of power-split portions of the optical signal corresponding to a quantity of WSSs 320. In some implementations, each power-split portion of the optical signal may represent the information of the optical signal with a transmission power proportional to the quantity of power-split portions and transmission power of the optical signal. In some implementations, passive power splitter 310 may include a rack-mounted passive splitter, a non-rack-mounted passive splitter, or the like.

WSS 320 may include, for example, a set of wavelength selective switches associated with routing an optical signal. For example, a particular WSS 320 may be associated with receiving a set of optical signals from another ROADM 260 and selectively routing a portion of the set of optical signals to a set of other WSSs 320 and/or a set of Rx devices 275. Additionally, or alternatively, a particular WSS 320 may be associated with receiving another set of optical signals from a set of other WSSs 320 and/or a set of Tx devices 240 and selectively routing a portion of the other set of optical signals to the other ROADM 260. In some implementations, WSS 320 may be connected to an amplifier device that is configured to increase the power associated with a power-split portion of a particular super-channel 245 that is received by WSS 320. In some implementations, WSS 320 may selectively route a portion of one or more received super-channels 245 to another WSS 320.

As further shown in FIG. 3A, a set of Tx devices 240-1 through 240-N may transmit a set of super-channels 245-1 through 245-N to the set of passive power splitters 310-1 through 310-N. For example, Tx device 240-1 may transmit super-channel 245-1 to passive power splitter 310-1. In some implementations, each passive power splitter 310, of the set of passive power splitters 310, may provide respective power-split portions of the set of super-channels 245 to each WSS 320 of the set of WSSs 320. For example, passive power splitter 310-1 may provide a first power split portion of super-channel 245-1 (e.g., a power split portion that is associated with information of super-channel 245-1 and a proportionally reduced transmission power) to WSS 320-1 (e.g., super-channel 245-1 (1)), a second power-split portion of super-channel 245-1 to WSS 320-2, an mth power split-portion of super-channel 245-1 to WSS 320-M (e.g., super-channel 245-1 (M)), etc. In other words, each WSS 320 receives a passively power-split copy of each super-channel 245 of the set of super-channels 245.

In this way, multiple Tx devices 240, of ROADM 260, may direct an optical signal to multiple WSSs 320, of the ROADM 260, associated with routing the optical signal to respective other ROADMs 260.

Although FIG. 3A is described in terms of super-channels being transmitted by Tx device 240, FIG. 3A may also refer to a set of super-channels, a set of channels, a set of subcarriers, or the like being transmitted by Tx device 240.

As shown in FIG. 3B, ROADM 260 may include a set of Rx devices 275-1 through 275-Q (Q≥1), a set of WSS 320-R through 320-P (P≥1), and a set of power combiners 330-1 through 330-Q (Q≥1) (hereinafter referred to individually as "power combiner 330," and collectively as "power combiners 330").

Power combiner 330 may include, for example, a power combiner that is configured to combine multiple optical signals and route the multiple optical signals to Rx device 275. In some implementations, power combiner 330 may include an active power combiner, a passive power combiner, or the like. In some implementations, power combiner 330 may include another type of combiner, such as a WSS, an arrayed waveguide grating (AWG), a fixed passive spectral filter, or the like.

As further shown in FIG. 3B, the set of WSSs 320-R through 320-P may receive a set of optical signals (e.g., from a set of network devices 230, from a set of other WSSs 320 associated with a set of other ROADMs 260, or the like) that may include one or more super-channels 245. In some implementations, a particular WSS 320 may be associated with a set of optical links 285. For example WSS 320-R may be associated with optical link 285-R (1) to power combiner 330-1, optical link 285-R (Q) to power combiner 330-Q, etc. Similarly, WSS 320-P may be associated with optical link 285-P (1) to power combiner 330-1, optical link 285-P (Q) to passive power combiner 330-P, etc. In some implementations, WSS 320 may selectively route one or more portions of the set of optical signals to one or more power combiners 330, of the set of power combiners 330, via one or more optical links 285. For example, WSS 320-R may, when receiving an optical signal that includes super-channel 245-R, route a portion of super-channel 245-R (e.g., super-channel 245-R (1)) via optical link 285-R (1). In some implementations, a particular power combiner 330 may receive multiple portions of multiple super-channels 285 and may combine and route the multiple portions to a particular Rx device 275. For example, power combiner 330-1 may receive super-channel 245-R (1) and super-channel 245-P (1) and may combine into super-channel 245-1' for routing to Rx device 275-1.

In this way, multiple Rx devices 275, of ROADM 260, may selectively receive a portion of multiple optical signals received by multiple WSSs 320 of ROADM 260.

Although FIG. 3B is described in terms of super-channels being received by Rx device 275, FIG. 3B may also refer to a set of super-channels, a set of channels, a set of subcarriers, or the like being received by Rx device 275.

The number and arrangement of components shown in FIGS. 3A and 3B are provided as an example. In practice, ROADM 260 may include additional components, fewer components, different components, or differently arranged components than those shown in FIGS. 3A and 3B. Additionally, or alternatively, a set of components shown in FIGS. 3A and 3B may perform one or more functions described herein as being performed by another set of components shown in FIGS. 3A and 3B.

Figure 4:
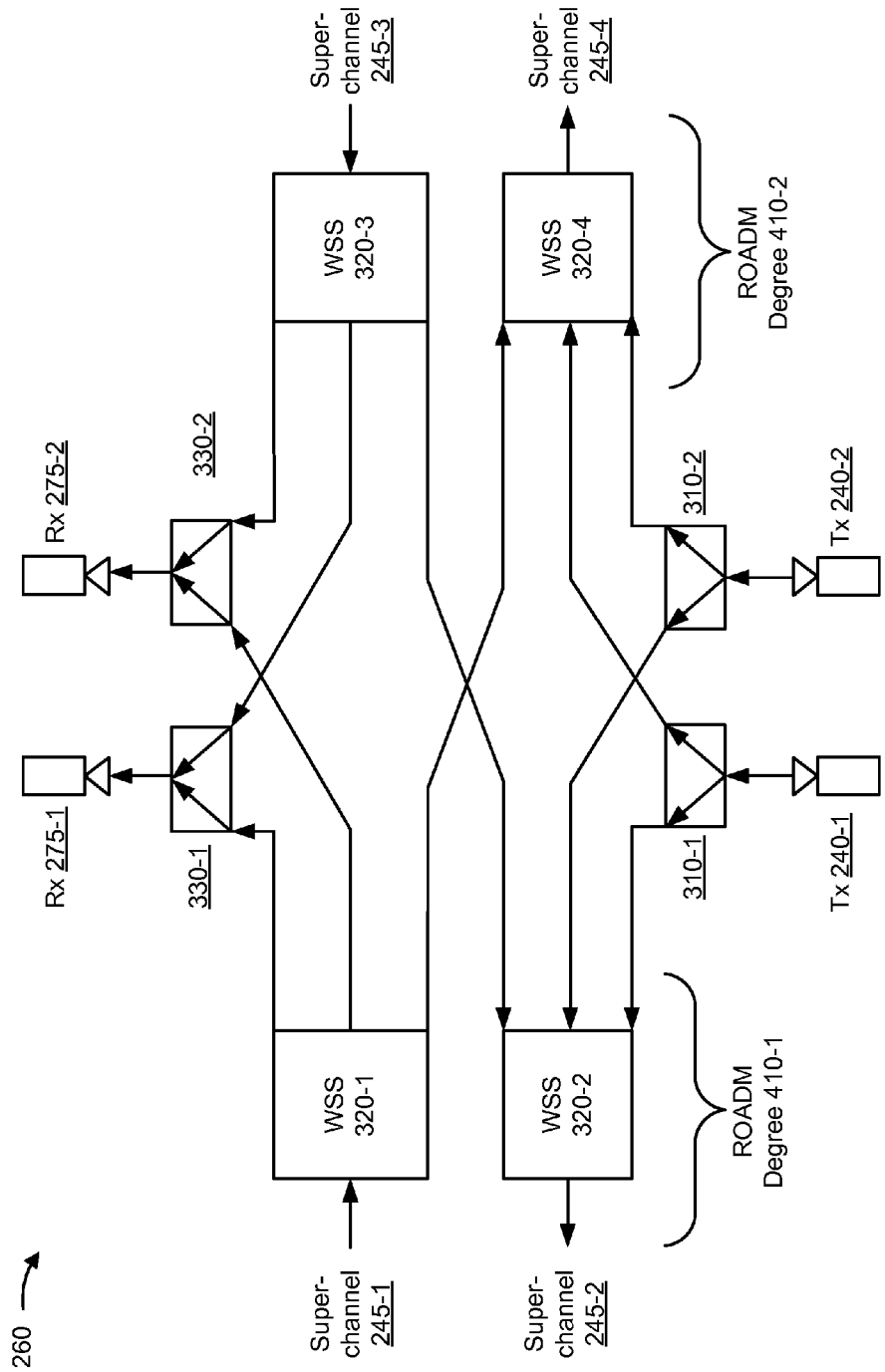
FIG. 4 is another diagram of example components of the reconfigurable optical add-drop multiplexer shown in FIGS. 2A-2E.

FIG. 4 is a diagram of an example implementation of ROADM 260 shown in FIG. 2B and FIGS. 3A and 3B. As shown in FIG. 4, ROADM 260 includes ROADM degree 410-1 and ROADM degree 410-2, a set of Tx devices 240-1 and 240-2, which are associated with a corresponding set of passive power splitters 310-1 and 310-2, and a set of Rx devices 275-1 and 275-2, which are associated with a corresponding set of power combiners 330-1 and 330-2. ROADM degree 410-1 includes WSS 320-1, which is associated with receiving super-channel 245-1 from first ROADM 260, and WSS 320-2, which is associated with providing super-channel 245-2 to first ROADM 260. ROADM degree 410-2 includes WSS 320-3, which is associated with receiving super-channel 245-3 from second ROADM 260, and WSS 320-4, which is associated with providing super-channel 245-4 to second ROADM 260.

WSS 320-1 receives super-channel 245-1 and selectively provides a portion of super-channel 245-1 to power combiner 330-1, power combiner 330-2, and/or WSS 320-4. For example, WSS 320-1 may provide a first set of channels of super-channel 245-1 to power combiner 330-1, a second set of channels of super-channel 245-1 to power combiner 330-2, and a third set of channels of super-channel 245-1 to WSS 320-4. In some implementations, the first set of channels, the second set of channels, and/or the third set of channels may be the same set of channels, a different set of channels, or a combination of the same and different sets of channels. Similarly, WSS 320-3 may receive super-channel 245-3 and may selectively provide a portion of super-channel 245-3 to power combiner 330-1, power combiner 330-2, and/or WSS 320-2.

Power combiner 330-1 may receive a portion of super-channel 245-1 from WSS 320-1 and a portion of super-channel 245-3 from WSS 320-3. Power combiner 330-1 may power combine the portion of super-channel 245-1 and super-channel 245-2, to generate a power-combined optical signal. Power combiner 330-1 may provide the power-combined optical signal to Rx device 275-1 for detection, processing, or the like. Similarly, power combiner 330-2 may provide a portion of super-channel 245-1, received from WSS 320-1, and a portion of super-channel 245-3, received from WSS 320-3, to Rx device 275-2 for detection, processing, or the like. In this way, WSS 320 may route a particular super-channel 245 to another WSS 320 for transmission to another ROADM 260 or to an Rx device 275, of a set of Rx devices 275, for detection, processing, or the like, thereby facilitating CDC broadcast multiplexing.

Passive power splitter 310-1 may provide a first power-split portion of an optical signal, received from Tx device 240-1, to WSS 320-2 and a second power-split portion of the optical signal to WSS 320-4. Similarly, passive power splitter 310-2 may provide a first power-split portion of another optical signal, received from Tx device 240-2, to WSS 320-2 and a second power-split portion of the other optical signal to WSS 320-4.

WSS 320-2 may receive a set of optical signals from passive power splitter 310-1, passive power splitter 310-2, and/or WSS 320-3. WSS 320-2 may selectively route a portion of or all of the set of optical signals as super-channel 245-2 to first ROADM 260. Similarly, WSS 320-4 may receive a set of optical signals from passive power splitter 310-1, passive power splitter 310-2, and/or WSS 320-1. WSS 320-4 may selectively route a portion of or all of the set of optical signals as super-channel 245-4 to second ROADM 260. In this way, WSS 320 may selectively route a set of optical signals received from a set of other network devices 230 (e.g., passive power splitter 310, another WSS 320, or the like) to another ROADM 260, thereby facilitating CDC broadcast multiplexing.

While FIG. 4 shows ROADM 260 as including a particular quantity and arrangement of components, in some implementations, ROADM 260 may include additional components, fewer components, different components, or differently arranged components.

FIG. 5 is a flow chart of an example process 500 for reducing WSS filter-based impairment using comparative channel pre-emphasis. In some implementations, one or more process blocks of FIG. 5 may be performed by network management device 210. In some implementations, one or more process blocks of FIG. 5 may be performed by another component or a set of components separate from or including network management device 210, such as network device 230 (e.g., Tx device 240, MUX 250, ROADM 260, DEMUX 270, Rx device 275) or the like.

As shown in FIG. 5, process 500 may include monitoring a set of channels to determine a bit error rate (block 510). For example, network management device 210 may monitor the set of channels to determine the bit error rate. A bit error rate may refer to a ratio of received bits of a data stream that have been altered and/or dropped (e.g., due to noise, interference, distortion, etc.) as compared to a total quantity of transferred bits. For example, when a super-channel is transmitted by Tx device 240 to WSS 320 (e.g., via passive power splitter 310) for transmission to another ROADM 260, the super-channel may be filtered (e.g., by a pass-band filter associated WSS 320). In some implementations, the set of channels may include multiple channels with different sets of wavelengths (e.g., sets of wavelength ranges). In some implementations, network management device 210 may monitor the set of channels to determine another signal quality factor, such as a signal to noise ratio, a Q-factor, or the like.

The pass-band filter (sometimes referred to as a "band-pass filter") may permit a first set of frequencies to pass through with a first quantity attenuation and may permit a second set of frequencies to pass through with a second quantity of attenuation. For example, when the super-channel is filtered by the pass-band filter, frequencies (e.g., corresponding to a set of wavelengths) associated with a first set of channels may be passed through with a lesser attenuation compared with frequencies associated with a second set of channels. In some implementations, the pass-band filter may attenuate edge channels more than interior channels. An interior channel may refer to a channel for which the frequency range is surrounded by a pair of edge channels. For example, when a super-channel includes five sequential channels with non-overlapping frequency ranges, the super-channel may include two edge channels and three interior channels.

The bit error rate may correspond to an attenuation of a channel by the pass-band filter, in some implementations. For example, a first channel, that undergoes greater attenuation by the pass-band filter than a second channel, may be associated with a higher bit error rate than the second channel. In some implementations, the bit error rate may correspond to transmission power after attenuation. For example, a first channel, with a greater transmission power than a second channel after attenuation, may be associated with a lower bit error rate after transmission.

Network management device 210 may determine the bit error rate by monitoring one or more network devices 230, in some implementations. For example, network management device 210 may monitor a set of bits transmitted by a set of Tx devices 240 and received by a set of Rx devices 275. In some implementations, the set of bits may be attenuated by a pass-band filter of a first WSS 320 associated with a first ROADM 260 that includes Tx devices 240. Additionally, or alternatively, the set of bits may be attenuated by a pass-band filter of a second WSS 320 associated with a second ROADM 260 that includes Rx devices 275. Additionally, or alternatively, the set of bits may be attenuated by one or more pass-band filters of one or more WSSs 320 associated with one or more ROADMs 260 associated with routing the set of bits from first ROADM 260 to second ROADM 260.

As further shown in FIG. 5, process 500 may include determining that a bit error rate for the set of channels does not satisfy a bit error rate threshold (block 520). For example, network management device 210 may determine that the bit error rate for the set of channels does not satisfy a threshold. In some implementations, network management device 210 may determine that the bit error rate does not satisfy a bit error rate threshold based on the bit error rate for a particular channel of the set of channels. In some implementations, network management device 210 may determine that the bit error rate does not satisfy a threshold associated with a differential bit error rate (e.g., a difference in a first bit error rate for a first channel of a super-channel compared with a second bit error rate for a second channel of the super-channel, or the like).

Network management device 210 may determine the threshold based on one or more factors, in some implementations. For example, network management device 210 (e.g., or an operator, thereof) may determine a risk of damage to a component of ROADM 260 as a consequence of altering a bit error rate, and may set a particular threshold so that a cost-benefit of the risk of damage is outweighed by degraded network performance associated with the bit error rate.

Additionally, or alternatively, network management device 210 may determine that a first network usage is associated with a first threshold and a second network usage is associated with a second threshold. For example, network management device 210 (e.g., or an operator, thereof) may determine that a first type of information is comparatively less error-tolerant than a second type of information, and network management device 210 may select a comparatively lower bit error rate threshold for when ROADM 260 is configured to route the first type of information than the bit error rate threshold for when ROADM 260 is configured to route the second type of information.

In some implementations, network management device 210 may determine a network performance score based on a set of factors (e.g., a bit error rate factor, a power management factor, a risk of component failure factor, or the like), and may select a threshold based on maximizing the network performance score for a super-channel, for a particular channel, or the like. Additionally, or alternatively, network management device 210 may select a bit error rate threshold based on determining an availability of one or more other techniques for reducing WSS filter-based impairment.

As further shown in FIG. 5, process 500 may include adjusting a transmission power for one or more channels of the set of channels (block 530). For example, network management device 210, may perform comparative channel pre-emphasis by adjusting the transmission power for one or more channels of the set of channels based on determining that the bit error rate does not satisfy the threshold. Comparative channel pre-emphasis may refer to increasing a transmission power of a first channel as compared to a transmission power of a second channel prior to attenuation via the pass-band filter. In this way, a bit error rate and/or a differential bit error rate associated with WSS filter-based impairment may be reduced resulting in increased network performance.

In some implementations, network management device 210 may increase the transmission power for a particular channel, of the set of channels, to lower a bit error rate. For example, when the particular channel is associated with a higher bit error rate than another channel, network management device 210 may utilize an amplifier, configure Tx device 240, configure a variable optical attenuator, or the like to increase transmission power associated with the particular channel. In this way, network management device 210 may lower a bit error rate associate with the particular channel, thereby decreasing a differential bit error rate between the particular channel and the other channel.

In some implementations, network management device 210 may decrease a transmission power for a particular channel, of the set of channels, to raise a bit error rate. For example, when the particular channel is associated with a lower bit error rate than another channel, network management device 210 may configure Tx device 240, a variable optical attenuator, or the like, to decrease transmission power for the particular channel. In this way, network management device 210 may raise a bit error rate associated with the particular channel, thereby decreasing a differential between the bit error rate of the particular channel and the other bit error rate of the other channel.

In some implementations, network management device 210 may cause a transmitter to redistribute information that was to be transferred via a channel. For example, network management device 210 may cause information associated with a first channel to be transmitted via a second channel based on altering the transmission power of the first channel and/or the second channel.

In some implementations, network management device 210 may perform one or more other techniques to reduce the impact of WSS filter-based impairment, such as using differentiated channel modulation formats (e.g., as described with respect to FIG. 7), multi-channel forward error correction interleaving (e.g., as described with respect to FIGS. 9A and 9B), differentiated channel baud rates (e.g., as described with respect to FIG. 11), selective subcarrier adjustment (e.g., as described with respect to FIG. 13), or the like. For example, when network management device 210 determines that raising a transmission power for a channel to a first power outweighs the risk of component damage and raising the transmission power for the channel to a second power does not outweigh the risk of component damage, network management device 210 may raise the transmission to the first power to lower a bit error rate to a first bit error rate, and network management device 210 may utilize differentiated channel baud rates to lower the bit error rate to a second, lower bit error rate. In this way, network management device 210 may combine multiple techniques that reduce the impact of WSS filter-based impairment to achieve greater network performance than may be achieved utilizing a single technique.

In some implementations, network management device 210 may utilize a feedback loop to control adjustment of a transmission power of a channel. For example, network management device 210 may monitor optical network 220 and return to block 510.

Although FIG. 5 shows process 500 as being performed by network management device 210, comparative channel pre-emphasis may be performed prior to installation of an optical transport network. For example, it may be determined, based on testing, simulation, or the like, that a particular bit error rate will be associated with a particular channel, a set of Tx devices 240 may be configured utilizing differential transmission powers to perform comparative channel pre-emphasis (without interaction with network management device 210), and a set of Rx devices 275 may be configured to receive optical signals from the set of Tx devices 240 (without interaction with network management device 210).

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6A:
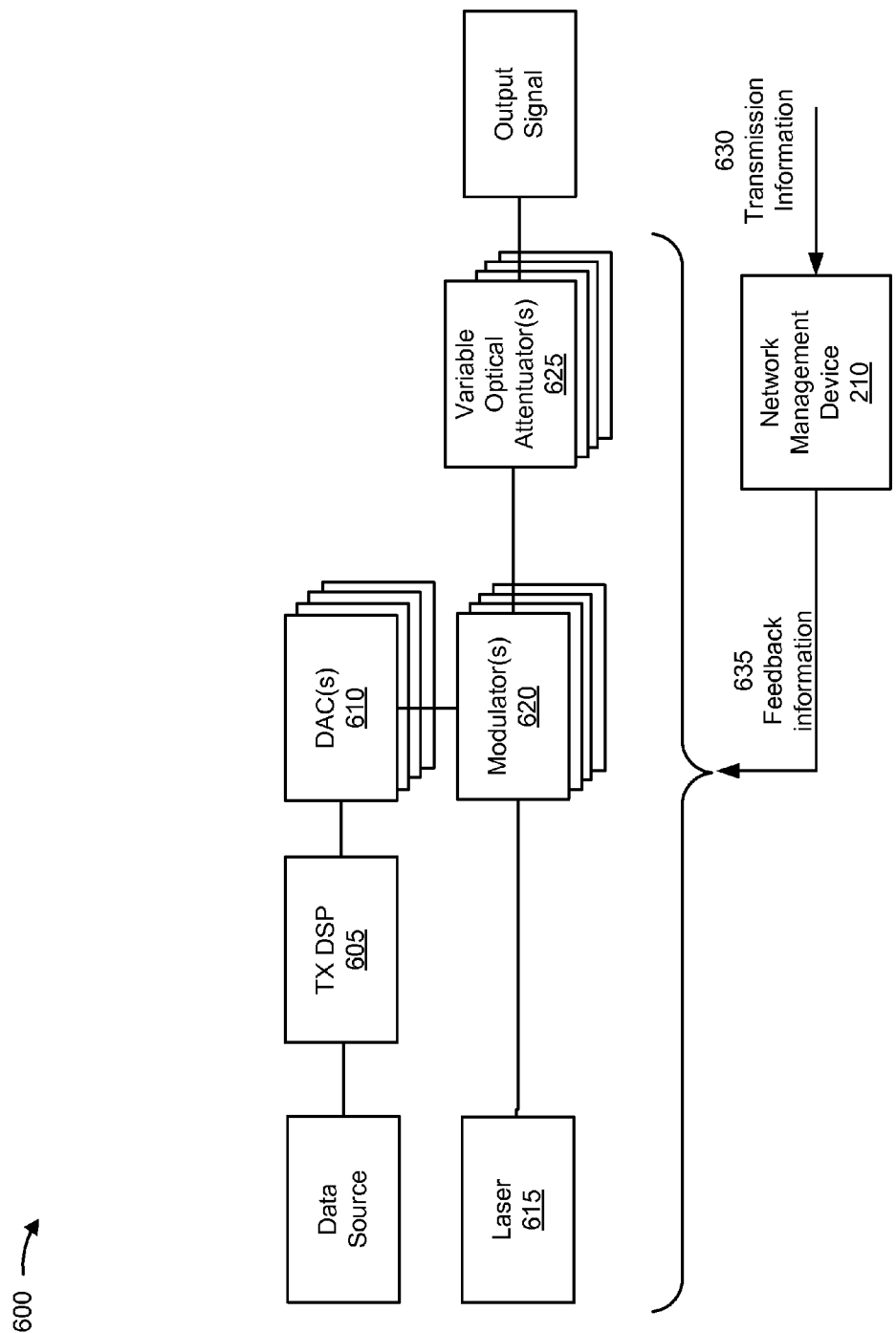
FIGS. 6A and 6B are diagrams of an example implementation relating to the example process shown in FIG. 5.
Figure 6B:
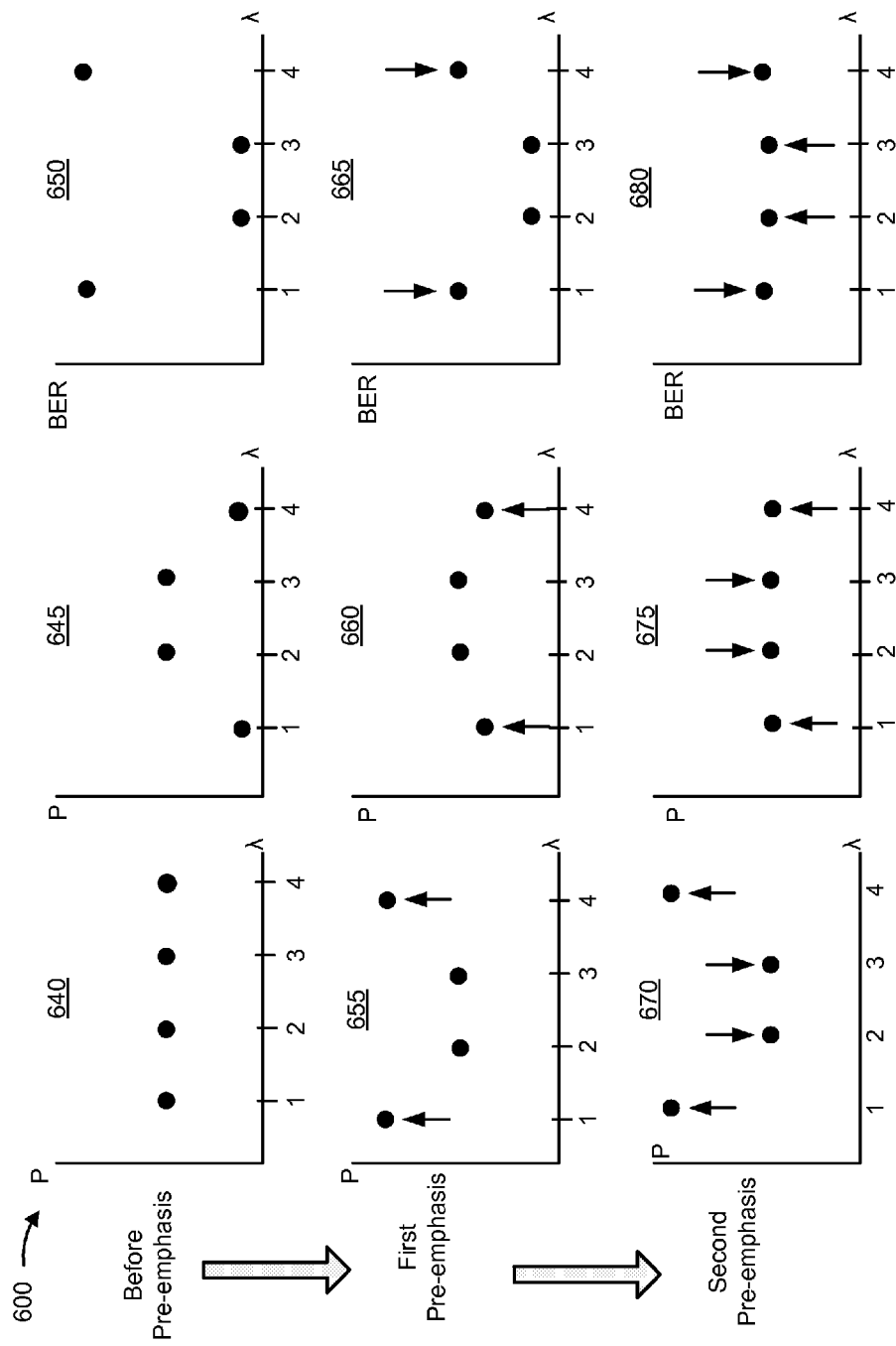

FIGS. 6A and 6B are diagrams of an example implementation 600 relating to example process 500 shown in FIG. 5. FIGS. 6A and 6B show an example of reducing WSS filter-based impairment using comparative channel pre-emphasis.

As shown in FIG. 6A, a transmitter of ROADM 260 may include a transmitter digital signal processor (Tx DSP) 605, one or more digital-to-analog converters (DACs) 610, a laser 615, one or more modulators 620, and one or more variable optical attenuators 625. In some implementations, Tx DSP 605, DACs 610, laser 615, modulators 620, and/or variable optical attenuators 625 may be implemented on one or more integrated circuits, such as one or more PICs, one or more ASICs, or the like. In some implementations, components of multiple transmitters may be implemented on a single integrated circuit, such as a single PIC, to form a super-channel transmitter.

Tx DSP 605 may include a digital signal processor or a collection of digital signal processors. In some implementations, Tx DSP 605 may receive a data source (e.g., a signal received via a Tx channel), may process the signal, and may output digital signals having symbols that represent components of the signal (e.g., an in-phase x-polarization component, a quadrature x-polarization component, an in-phase y-polarization component, and a quadrature y-polarization component).

DAC 610 may include a digital-to-analog converter or a collection of digital-to-analog converters. In some implementations, DAC 610 may receive respective digital signals from Tx DSP 605, may convert the received digital signals to analog signals, and may provide the analog signals to modulator 620. The analog signals may correspond to electrical signals (e.g., voltage signals) to drive modulator 620. In some implementations, a transmitter may include multiple DACs 610, where a particular DAC 610 may correspond to a particular polarization (e.g., an x-polarization, a y-polarization) of a signal and/or a particular component of a signal (e.g., an in-phase component, a quadrature component).

Laser 615 may include a semiconductor laser, such as a distributed feedback (DFB) laser, or some other type of laser. Laser 615 may provide an output optical light beam to modulator 620.

Modulator 620 may include a Mach-Zehnder modulator (MZM), such as a nested MZM, or another type of modulator. Modulator 620 may receive the optical light beam from laser 615 and the voltage signals from DAC 610, and may modulate the optical light beam, based on the voltage signals, to generate a multiple subcarrier output signal, which may be provided to a multiplexer.

In some implementations, a transmitter may include multiple modulators 620, which may be used to modulate signals of different polarizations. For example, an optical splitter may receive an optical light beam from laser 615, and may split the optical light beam into two branches: one for a first polarization (e.g., an x-polarization) and one for a second polarization (e.g., the y-polarization). The splitter may output one optical light beam to a first modulator 620, which may be used to modulate signals of the first polarization, and another optical light beam to a second modulator 620, which may be used to modulate signals of the second polarization. In some implementations, two DACs 610 may be associated with each polarization. In these implementations, two DACs 610 may supply voltage signals to the first modulator 620 (e.g., for an in-phase component of the x-polarization and a quadrature component of the x-polarization), and two DACs 610 may supply voltage signals to the second modulator 620 (e.g., for an in-phase component of the y-polarization and a quadrature component of the y-polarization). The outputs of modulators 620 may be combined back together using combiners and polarization multiplexing. For example, a combiner, such as a power-combiner, an AWG, a WSS, a fixed passive spectral filter, or the like, (not shown) may combine a set of modulated optical signals and provide the output signal.

Variable optical attenuator 625 may include one or more devices associated with selectively altering a transmission power of an optical signal. For example, variable optical attenuator may be configured to reduce a transmission power associated with a channel of a super-channel. In some implementations, variable optical attenuator 625 may be reconfigured to reduce a quantity of attenuation, thereby increasing a transmission power of the output signal. In some implementations, variable optical attenuator 625 may receive modulated optical signals from modulator 620, attenuate the modulated optical signals to produce an output signal, and provide the output signal.

As further shown in FIG. 6A, and by reference number 630, network management device 210 may receive transmission information regarding a bit error rate of a set of channels being provided by the transmitter, and as shown by reference number 635, provide feedback information associated with causing variable optical attenuator 625 to attenuate a channel to reduce a transmission power for the channel, thereby performing comparative channel pre-emphasis. Additionally, or alternatively, network management device 210 may cause variable optical attenuator 625 to reduce attenuation of the channel to increase a power for the channel, thereby performing comparative channel pre-emphasis. Additionally, or alternatively, network management device 210 may provide feedback information to one or more other components of the transmitter, such as Tx DSP 605, DAC 610, laser 615, modulator 620, or the like to reduce or increase a transmission power associated with a channel, of a set of channels, thereby performing comparative channel pre-emphasis.

The number and arrangement of components shown in FIG. 6A are provided as an example. In practice, a transmitter performing comparative channel pre-emphasis may include additional components, fewer components, different components, or differently arranged components than those shown in FIG. 6A. Additionally, or alternatively, a set of components shown in FIG. 6A may perform one or more functions described herein as being performed by another set of components shown in FIG. 6A.

As shown in FIG. 6B, and by reference number 640, a transmitter may transmit a set of channels toward a WSS (e.g., a first channel, a second channel, a third channel, and a fourth channel). The transmitter transmits each channel utilizing the same power level. The first channel and the fourth channel experience greater attenuation as a result of the pass-band filter than the second channel and the third channel. As shown by reference number 645, the transmission power after attenuation by a pass-band filter of the WSS is less for the first and fourth channel compared with the second and third channel. As shown by reference number 650, based on attenuation from the pass-band filter, the first channel and the fourth channel have greater bit error rates than the second channel and the third channel. Assume that network management device 210 performs comparative channel pre-emphasis. As shown by reference number 655, transmission power for the first channel and the fourth channel prior to attenuation by the pass-band filter is increased. As shown by reference number 660, the transmission power for the first channel and the fourth channel after attenuation by the pass-band filter is increased based on the pre-attenuation power being increased. As shown by reference number 665, the bit error rate for the first channel and the fourth channel decreases based on the transmission power after attenuation increasing. Assume that network management device 210 further performs comparative channel pre-emphasis. As shown by reference number 670, transmission power pre-attenuation for the first channel and the fourth channel increases and transmission power for the second channel and the third channel decreases. As shown by reference number 675, transmission power post-attenuation increases for the first channel and fourth channel and decreases for the second channel and third channel. As shown by reference number 670, the bit error rate for the first channel and the fourth channel decreases and the bit error rate for the second channel and the third channel increases, thereby reducing a differential bit error rate.

As indicated above, FIGS. 6A and 6B are provided merely as an example. Other examples are possible and may differ from what was described with regard to FIGS. 6A and 6B.

Figure 7:
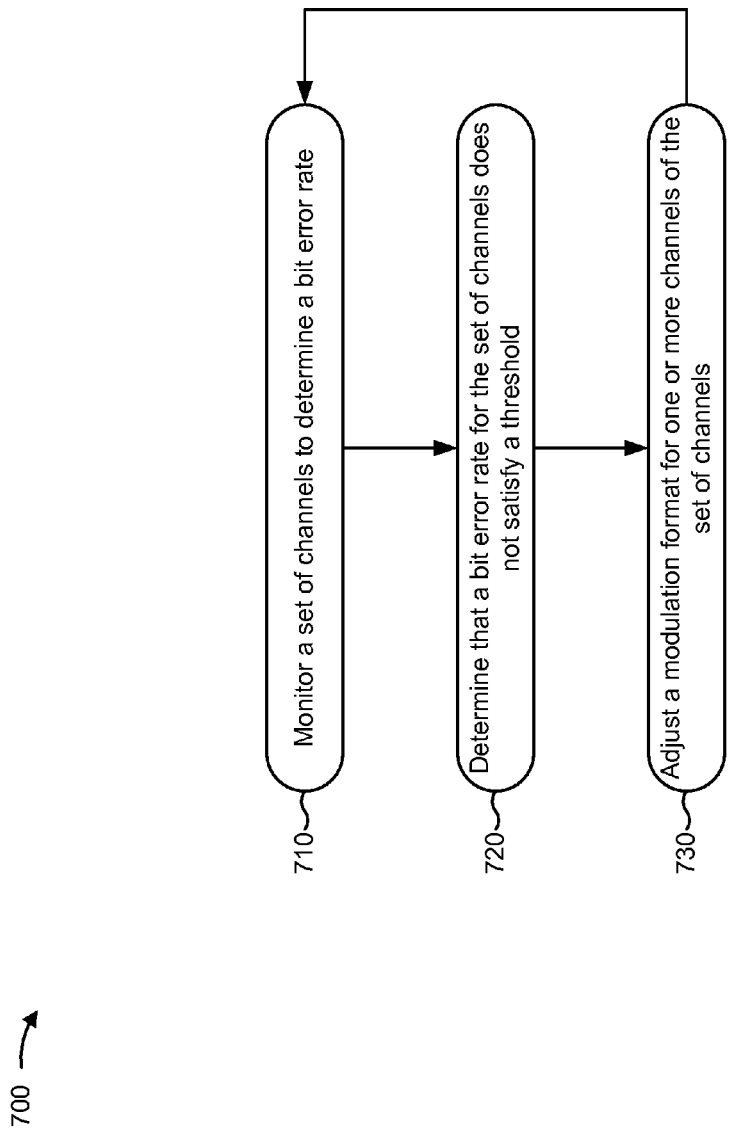
FIG. 7 is a flow chart of an example process for reducing WSS filter-based impairment using differentiated channel modulation formats.

FIG. 7 is a flow chart of an example process 700 for reducing WSS filter-based impairment using differentiated channel modulation formats. In some implementations, one or more process blocks of FIG. 7 may be performed by network management device 210. In some implementations, one or more process blocks of FIG. 7 may be performed by another component or a set of components separate from or including network management device 210, such as network device 230 (e.g., Tx device 240, MUX 250, ROADM 260, DEMUX 270, Rx device 275) or the like.

As shown in FIG. 7, process 700 may include monitoring a set of channels to determine a bit error rate (block 710). For example, network management device 210 may monitor the set of channels to determine the bit error rate. In some implementations, the bit error rate may correspond to a modulation format. For example, a first channel with a first modulation format may be associated with a different bit error rate than a second channel with a second modulation format. In some implementations, network management device 210 may determine the bit error rate based on receiving information from one or more components of a transmitter, as discussed herein with respect to FIG. 5. In some implementations, network management device 210 may monitor the set of channels to determine another signal quality factor, such as a signal to noise ratio, a Q-factor, or the like.

As further shown in FIG. 7, process 700 may include determining that a bit error rate for the set of channels does not satisfy a threshold (block 720). For example, network management device 210 may determine that the bit error rate does not satisfy a bit error rate threshold and/or a differential bit error rate threshold, as discussed herein with respect to FIG. 5, and may determine to alter a modulation format based on determining that the bit error rate does not satisfy the bit error rate threshold. A particular modulation format may be associated with a particular bit error rate when attenuated by a pass-band filter and a particular data transmission rate. For example, quadrature phase shift keying (QPSK) may be associated with a greater bit error rate and a greater data transmission rate than binary phase shift keying (BPSK). Similarly, 8-quadrature amplitude modulation (8-QAM) may be associated with a greater bit error rate and a greater data transmission rate than QPSK, and 16-QAM may be associated with a greater bit error rate and a greater data transmission rate than 8-QAM. Additionally, or alternatively, different modulation formats may correspond to different potential data transfer distances.

In some implementations, network management device 210 may select the threshold based on a modulation format criteria. For example, network management device 210 may determine a particular bit error rate threshold for adjusting from a first modulation format to a second modulation format based on a change to a data transmission rate and potential transmission distance associated therewith. Similarly, network management device 210 may determine another bit error rate threshold for adjusting from the first modulation format to a third modulation format based on a change to a data transmission rate and potential transmission distance associated therewith.

In some implementations, network management device 210 may determine a network performance score based on a set of factors (e.g., a bit error rate factor, a modulation format factor, such as a data transmission rate factor, a potential transmission distance factor, or the like), and may select a threshold based on the network performance score for a super-channel, for a particular channel, or the like. Additionally, or alternatively, network management device 210 may select the threshold based on determining an availability of one or more other techniques for reducing WSS filter-based impairment.

As further shown in FIG. 7, process 700 may include adjusting a modulation format for one or more channels of the set of channels (block 730). For example, network management device 210 may reduce WSS filter-based impairment using differentiated channel modulation formats based on determining that the threshold is not satisfied. Differentiated channel modulation formats may refer to utilizing different signal modulation formats for multiple channels. For example, network management device 210 may cause a first channel to be modulated using a first modulation format and a second channel to be modulated using a second modulation format.

In some implementations, network management device 210 may cause a particular channel to be modulated with a modulation format that results in decreased bit error rate. For example, when a particular channel is associated with a greater bit error rate than another channel (e.g., caused by attenuation via a pass-band filter associated with WSS 320), network management device 210 may decrease a bit error rate associated with the particular channel by altering its modulation format from QPSK to BPSK. In this way, network management device 210 may reduce a differential bit error rate between the particular channel and the other channel.

Additionally, or alternatively, when the particular channel is associated with a lower bit error rate than another channel, network management device 210 may increase a bit error rate associated with the particular channel by altering modulation format from QPSK to BPSK. In this way, network management device 210 may reduce a differential bit error rate between the particular channel and the other channel.

Additionally, or alternatively, network management device 210 may increase a bit error rate associated with a first channel by altering its modulation format from QPSK to 8-QAM, and decrease a bit error rate associated with a second channel by altering its modulation format from QPSK to BPSK. In some implementations, network management device 210 may cause a transmitter to redistribute information that was to be transferred via a channel. For example, network management device 210 may cause information associated with a first channel to be transmitted via a second channel based on altering the channels.

In some implementations, network management device 210 may perform one or more other techniques to reduce the impact of WSS filter-based impairment, such as using comparative channel pre-emphasis (e.g., as described with respect to FIG. 5), multi-channel forward error correction interleaving (e.g., as described with respect to FIGS. 9A and 9B), differentiated channel baud rates (e.g., as described with respect to FIG. 11), selective subcarrier adjustment (e.g., as described with respect to FIG. 13), or the like. For example, network management device 210 may alter a modulation format from 8-QAM to QPSK and utilize comparative channel pre-emphasis to reduce a bit error rate without overly reducing a data rate and/or a potential transmission distance. In this way, network management device 210 may combine multiple techniques that reduce the impact of WSS filter-based impairment to achieve greater optical transport network performance than may be achieved utilizing a single technique.

In some implementations, network management device 210 may utilize a feedback loop to control adjusting a modulation format. For example, network management device 210 may monitor optical network 220 and return to block 710.

Although FIG. 7 shows process 700 as being performed by network management device 210, differentiated channel modulation formats may be configured prior to installation of an optical transport network. For example, it may be determined, based on testing, simulation, or the like, that a particular bit error rate will be associated with a particular channel, a set of transmitters may be configured to utilize differentiated channel modulation formats for multiple channels (without interaction with network management device 210), and a set of receivers may be configured to utilize differentiated channel modulation formats for multiple channels (without interaction with network management device 210).

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8A:
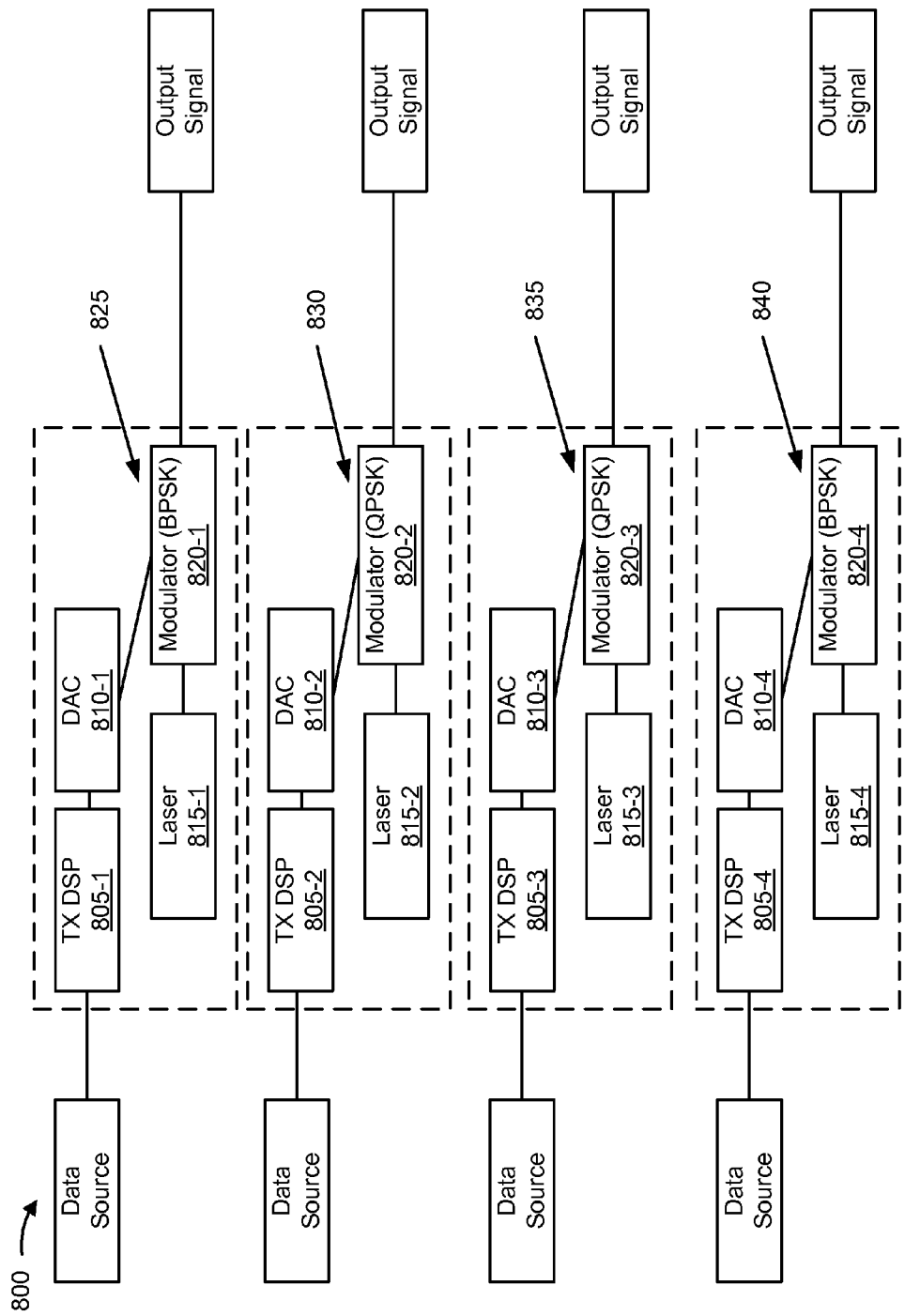
FIGS. 8A and 8B are diagrams of an example implementation relating to the example process shown in FIG. 7.
Figure 8B:
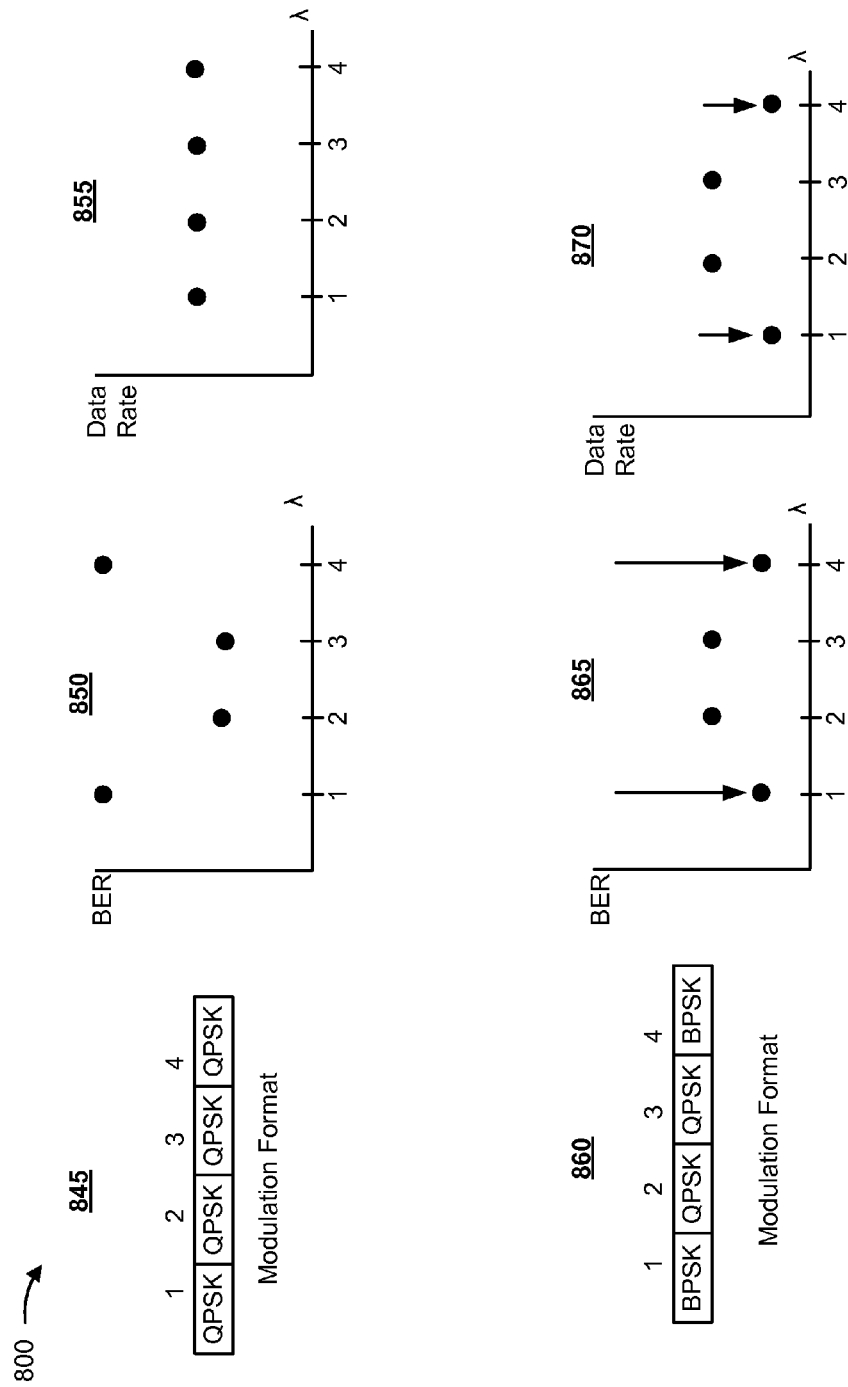

FIGS. 8A and 8B are diagrams of an example implementation 800 relating to example process 700 shown in FIG. 7. FIGS. 8A and 8B show an example of reducing WSS filter-based impairment using differentiated channel modulation formats.

As shown in FIG. 8A, a set of transmitters of ROADM 260, may include one or more transmitter digital signal processors (Tx DSPs) 805, one or more digital-to-analog converters (DACs) 810, one or more lasers 815, and one or more modulators 820. In some implementations, Tx DSPs 805, DACs 810, lasers 815, and/or modulators 820 may be implemented on one or more integrated circuits, such as one or more PICs, one or more ASICs, or the like. Tx DSP 805 may include a digital signal processor or a collection of digital signal processors, DAC 810 may include a digital-to-analog converter or a collection of digital-to-analog converters, laser 815 may include a semiconductor laser or some other type of laser, and modulator 620 may include a MZM modulator or another type of modulator, as described herein with respect to FIG. 6A.

In some implementations, modulator 820 may be configured to utilize a set of modulation formats, such as BPSK, QPSK, 8-QAM, 16-QAM, or the like. In some implementations, network management device 210 may provide an indication of a particular modulation format that a particular modulator 820 is to utilize. Additionally, or alternatively, modulator 820 may be configured to utilize a single particular modulation format, and may be installed in ROADM 260 to provide channels utilizing the particular modulation format based on an expected attenuation of signals by a pass-band filter.

As further shown by FIG. 8A, and by reference number 825, for an example set of transmitters associated with ROADM 260, modulator 820-1 may be associated with providing transmissions utilizing BPSK modulation. As shown by reference number 830, modulator 820-2 may be associated with utilizing QPSK modulation. As shown by reference number 835, modulator 820-3 may be associated with utilizing QPSK modulation. As shown by reference number 840, modulator 820-4 may be associated with utilizing BPSK modulation. In some implementations, a set of de-modulators associated with a set of receivers (e.g., that may correspond to Rx device 275) may be configured to de-modulate channels transmitted by the example set of transmitters associated with ROADM 260.

The number and arrangement of components shown in FIG. 8A are provided as an example. In practice, a transmitter utilizing differentiated channel modulation formats may include additional components, fewer components, different components, or differently arranged components than those shown in FIG. 8A. Additionally, or alternatively, a set of components shown in FIG. 8A may perform one or more functions described herein as being performed by another set of components shown in FIG. 8A.

As shown in FIG. 8B, and by reference number 845, a set of channels are associated with a set of wavelengths and a corresponding modulation format (e.g., a first channel associated with QPSK, a second channel associated with QPSK, a third channel associated with QPSK, and a fourth channel associated with QPSK). As shown by reference number 850, the first channel and the fourth channel are attenuated more than the second channel and the third channel, resulting in a greater bit error rate for the first channel and the fourth channel compared with the second channel and the third channel. As shown by reference number 855, based on utilizing QPSK for each channel of the set of channels, each channel has the same data rate. Assume one or more transmitters associated with transmitting the set of channels are reconfigured and, as shown by reference number 860, the first channel is altered to be associated with BPSK modulation, the second channel is associated with QPSK modulation, the third channel is associated with QPSK modulation, and the fourth channel is altered to be associated with BPSK modulation. As shown by reference number 865, based on altering modulation formats for the first channel and the fourth channel, bit error rates for the first channel and the fourth channel are reduced. As shown by reference number 870, based on altering modulation formats for the first channel and the fourth channel, data rates for the first channel and the fourth channel are reduced.

As indicated above, FIGS. 8A and 8B are provided merely as an example. Other examples are possible and may differ from what was described with regard to FIGS. 8A and 8B.

Figure 9B:
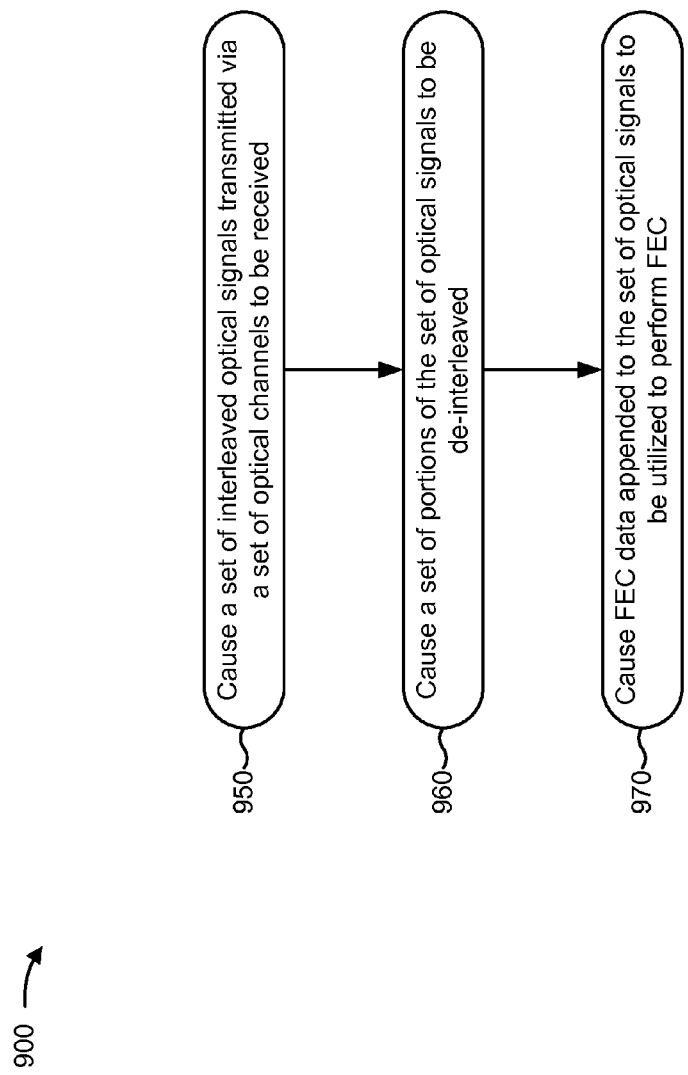

FIGS. 9A and 9B are flow charts of an example process 900 for reducing WSS filter-based impairment using multi-channel forward error correction averaging via an interleaving process. In some implementations, one or more process blocks of FIGS. 9A and 9B may be performed by network management device 210. In some implementations, one or more process blocks of FIG. 5 may be performed by another component or a set of components separate from or including network management device 210, such as network device 230 (e.g., Tx device 240, MUX 250, ROADM 260, DEMUX 270, Rx device 275) or the like.

As shown in FIG. 9A, process 900 may include determining to perform forward error correction (FEC) interleaving (block 910). For example, network management device 210 may determine to perform FEC interleaving. FEC may refer to appending error correction information that describes payload information (e.g., information that is to be transmitted via a set of optical signals) to the payload information allowing a receiver to determine the payload information despite bit errors in the payload information. In some implementations, FEC may be associated with a maximum bit error rate threshold. In some implementations, FEC may be associated another signal quality factor threshold, such as a signal to noise ratio threshold, a Q-factor threshold, or the like. For example, error correction information may facilitate reconstruction of payload information from a set of optical signals that includes a set of errors when the quantity of errors does not exceed a threshold quantity.

In some implementations, network management device 210 may determine to perform FEC interleaving based on a bit error rate and/or a differential bit error rate, associated with a super-channel, satisfying a threshold. For example, network management device 210 may determine a bit error rate threshold and may determine that the bit error rate threshold is satisfied, as described herein with respect to FIG. 5. Additionally, or alternatively, network management device 210 may determine to perform FEC interleaving based on an average bit error rate for multiple channels satisfying a FEC threshold. For example, network management device 210 may determine that when bit errors are averaged across multiple channels, FEC may be performed for each of the multiple channels, some of the multiple channels, or the like.

In some implementations, network management device 210 may determine to perform FEC interleaving based on a network configuration. For example, network management device 210 and/or one or more network devices 230 may be configured to perform FEC interleaving when a super-channel including multiple channels is being transmitted via optical network 220.

As further shown in FIG. 9A, process 900 may include causing FEC data to be appended to a set of optical signals associated with a set of channels (block 920). For example, network management device 210 may cause FEC data to be appended (e.g., by a transmitter) to the set of optical signals associated with the set of channels. In some implementations, the FEC data may include error correction information, such as a set of bits associated with payload information of the set of optical signals. For example, network management device 210 may cause redundant bits associated with the payload information (e.g., a set of redundant bits that permit a receiver to determine the payload information when an error is located within another set of bits of the payload information and/or the set of redundant bits) to be appended to a portion of an optical signal. Additionally, or alternatively, FEC data may include information associated with performing FEC, such as an information identifying a bit redundancy, identifying an interleaving algorithm, or the like.

As further shown in FIG. 9A, process 900 may include causing a set of portions of the set of optical signals to be interleaved (block 930). For example, network management device 210 may cause a transmitter of ROADM 260 and/or another similar device to interleave the set of portions of the set of optical signals. In some implementations, network management device 210 may utilize a particular interleaving algorithm when causing the transmitter of ROADM 260 to interleave the set of portions of the set of optical signals. For example, network management device 210 may provide a particular rearrangement algorithm to a FEC interleaver component of the transmitter and may provide the particular rearrangement algorithm to a FEC de-interleaver component of a receiver (e.g., a receiver associated with another ROADM 260).

In some implementations, network management device 210 may cause the transmitter of ROADM 260 to interleave portions of a particular channel within the particular channel. For example, the transmitter may rearrange bits of a portion of the particular channel according to an interleaving algorithm. In this way, bit errors, which may occur more commonly in proximity to one another, are averaged among locations of the particular channel at the receiver when the bits are de-interleaved instead of being concentrated at a particular location of the particular channel, thereby facilitating FEC.

Additionally, or alternatively, network management device 210 may cause the transmitter of ROADM 260 to interleave portions of multiple channels between the multiple channels. For example, the transmitter may divide a portion of information that is to be transmitted via a first channel into a first portion and a second portion and may cause the first portion to be provided via the first channel and the second portion to be provided via the second channel. Similarly, the transmitter may divide a portion of information that is to be transmitted via the second channel into a third portion and a fourth portion and may cause the third portion to be transmitted via the first channel and the fourth portion to be transmitted via the second channel. In this way, a transmitter may avoid concentration of bit errors on information being transmitted via any particular channel by interleaving a set of channels and then de-interleaving the set of channels to spread bit errors across the set of channels, thereby facilitating FEC.

As further shown in FIG. 9A, process 900 may include causing the set of optical signals to be transmitted (block 940). For example, network management device 210 may cause the set of optical signals to be transmitted (e.g., by a transmitter). In some implementations, network management device 210 may cause a transmitter of ROADM 260 to provide the set of optical signals to a passive power splitter, may cause the set of optical signals to be power split and provided to a set of WSSs with a set of pass-band filters, and may cause the set of optical signals to be routed via a set of other ROADMs to a receiver. In some implementations, the set of optical signals may incur a set of bit errors associated with signal noise, attenuation by one or more pass-band filters associated with one or more WSSs, or the like during transmission.

As shown in FIG. 9B, process 900 may include causing a set of interleaved optical signals transmitted via a set of optical channels to be received (block 950). For example, network management device 210 may cause a receiver device associated with ROADM 260 or another type of device to receive the set optical signals that have been interleaved. In some implementations, network management device 210 may cause the set of optical signals to be received by a WSS of a ROADM, passed through a pass-band filter, and routed to a receiver device. In some implementations, network management device 210 may determine that the set of optical signals have been interleaved based on receiving information from a transmitter of another ROADM 260, from another network management device 210, or the like.

As further shown in FIG. 9B, process 900 may include causing a set of portions of the set of channels to be de-interleaved (block 960). For example, network management device 210 may cause a FEC de-interleaver component of a receiver of ROADM 260 to de-interleave the set of portions of the set of channels. In some implementations, network management device 210 may provide information identifying a de-interleaving algorithm. For example, network management device 210 may provide information associated with re-arranging a set of bits within the set of optical signals, a set of portions between the optical signals, or the like.

As further shown in FIG. 9B, process 900 may include causing FEC data appended to the set of optical signals to be utilized to perform FEC (block 970). For example, network management device 210 may cause a receiver of ROADM 260 to utilize the FEC data that was appended to the set of optical signals to perform FEC on the de-interleaved set of channels. In some implementations, network management device 210 may utilize one or more other techniques to reduce WSS filter-based impairment in combination with multi-channel FEC interleaving. In some implementations, the receiver may perform FEC based on a FEC algorithm to recover payload information associated with the set of channels. In this way, multiple channels may be utilized with FEC to improve network performance by reducing lost payload information.

Although FIGS. 9A and 9B shows process 900 as being performed based on monitoring optical network 220, multi-channel FEC interleaving may be configured prior to installation of an optical transport network. For example, it may be determined, based on testing, simulation, or the like, that a particular bit error rate will be associated with a particular channel, and a set of transmitters may be configured to perform multi-channel FEC interleaving (without interaction with network management device 210), and a set of receivers may be configured to perform multi-channel FEC interleaving (without interaction with network management device 210).

Although FIGS. 9A and 9B shows example blocks of process 900, in some implementations, process 900 may include additional blocks, fewer blocks, different blocks, or differently arranged blocks than those depicted in FIGS. 9A and 9B. Additionally, or alternatively, two or more of the blocks of process 900 may be performed in parallel.

FIGS. 10A-10D are diagrams of an example implementation 1000 relating to example process 900 shown in FIGS. 9A and 9B. FIGS. 10A-10D show an example of reducing WSS filter-based impairment using multi-channel forward error correction averaging via an interleaving process.

Figure 10A:
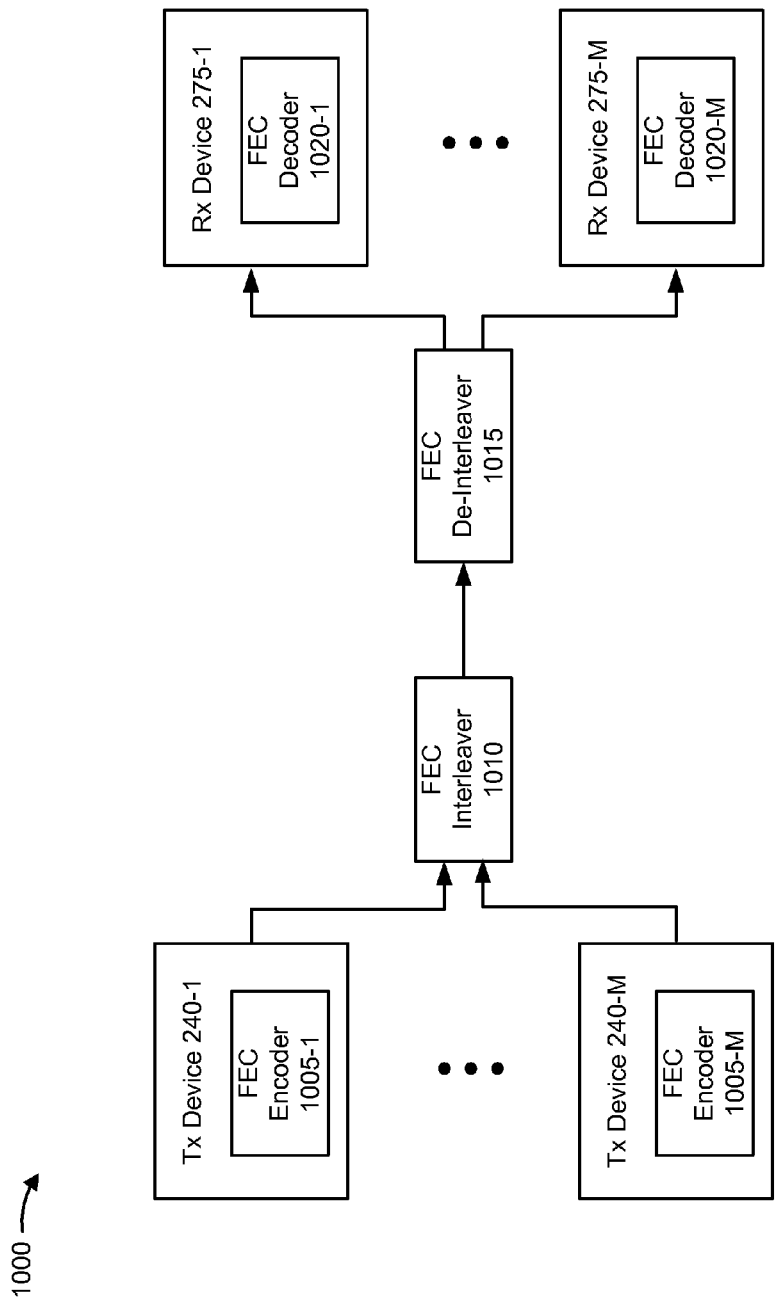
FIGS. 10A-10D are diagrams of an example implementation relating to the example process shown in FIGS. 9A and 9B.

As shown in FIG. 10A, optical network 220 may include a set of Tx devices 240-1 through 240-M (M≥1), which may include a set of corresponding FEC encoders 1005-1 through 1005-M (hereinafter referred to individually as "FEC encoder 1005," and collectively as "FEC encoders 1005"); a FEC interleaver 1010; a FEC de-interleaver 1015; and a set of Rx devices 275-1 through 275-M, which may include a set of corresponding FEC decoders 1020-1 through 1020-M (hereinafter referred to individually as "FEC decoder 1020," and collectively as "FEC decoders 1020").

Tx device 240 may include a transmitter, as described herein with respect to FIG. 2B. In some implementations, Tx device 240 may include a set of components, such as a Tx DSP, a DAC, a laser, a modulator, or the like, as described herein with respect to FIG. 6A. In some implementations, one or more Tx devices 240 may be associated with receiving input data and generating a set of optical signals associated with transmitting the input data via multiple channels. In some implementations, the multiple channels may be associated with one or more super-channels. In some implementations, Tx device 240 may include and/or be associated with FEC encoder 1005, FEC interleaver 1010, or the like.

FEC encoder 1005 may include a component capable of receiving, generating, processing, and/or providing information associated with performing FEC. In some implementations, FEC encoder 1005 may generate FEC data that includes a set of error correction bits corresponding to a set of payload bits of an optical signal associated with facilitating reconstruction of the optical signal after transmission of the optical signal. In some implementations, FEC encoder 1005 may utilize a particular algorithm for generating the FEC data. In some implementations, FEC encoder 1005 may provide information associated with determining the payload information based on the FEC data.

FEC interleaver 1010 may include a component capable of receiving, generating, processing, and/or providing information associated with an optical signal. In some implementations, FEC interleaver 1010 may rearrange bits of the optical signal within a channel of a super-channel. Additionally, or alternatively, FEC interleaver 1010 may rearrange portions of the optical signal between multiple channels of a super-channel. In some implementations, FEC interleaver 1010 may interleave the optical signal based on an interleaving algorithm. Additionally, or alternatively, FEC interleaver 1010 may provide information (e.g., to FEC de-interleaver 1015) associated with de-interleaving the optical signal. In some implementations, FEC interleaver 1010 may not alter FEC data associated with a channel when performing FEC interleaving. For example, when first FEC data is generated regarding a first channel and second FEC data is generated regarding a second channel, the first FEC data and the second FEC data may remain unchanged when interleaving is performed on the first channel and the second channel. In this case, the first FEC data and the second FEC data may not be usable to recover bits of the first channel and the second channel until the first channel and the second channel are de-interleaved.

FEC de-interleaver 1015 may include a component capable of receiving, generating, processing, and/or providing information associated with an optical signal. In some implementations, FEC de-interleaver 1015 may de-interleave bits of a set of optical signals within a channel, portions of a set of optical signals between multiple channels, or the like. In some implementations, FEC de-interleaver 1015 may perform de-interleaving based on an algorithm (e.g., a configured algorithm, a provided algorithm, or the like).

Rx device 275 may include a receiver, as described herein with respect to FIG. 2B. In some implementations, Rx device 275 may include a set of components, such a local oscillator, a hybrid mixer, a detector, an analog-to-digital converter, a receiver digital signal processor (Rx DSP), or the like. In some implementations, one or more Rx devices 275 may be associated with receiving input data and generating a set of optical signals associated with transmitting the input data via multiple channels. In some implementations, the multiple channels may be associated with one or more super-channels. In some implementations, Rx device 275 may include and/or be associated with FEC decoder 1020, FEC de-interleaver 1015, or the like.

FEC decoder 1020 may include a component capable of receiving, generating, processing, and/or providing information associated with performing FEC. In some implementations, FEC decoder 1020 may determine FEC data that includes a set of error correction bits corresponding to a set of payload bits of an optical signal associated with facilitating reconstruction of the optical signal after transmission of the optical signal. In some implementations, FEC decoder 1020 may utilize a particular algorithm for processing the FEC data to perform FEC. In some implementations, FEC decoder 1020 may provide payload information associated with a set of optical signals based on performing FEC.

The number and arrangement of components shown in FIG. 10A are provided as an example. In practice, a transmitter performing multi-channel FEC interleaving may include additional components, fewer components, different components, or differently arranged components than those shown in FIG. 10A. Additionally, or alternatively, a set of components shown in FIG. 10A may perform one or more functions described herein as being performed by another set of components shown in FIG. 10A.

Figure 10B:
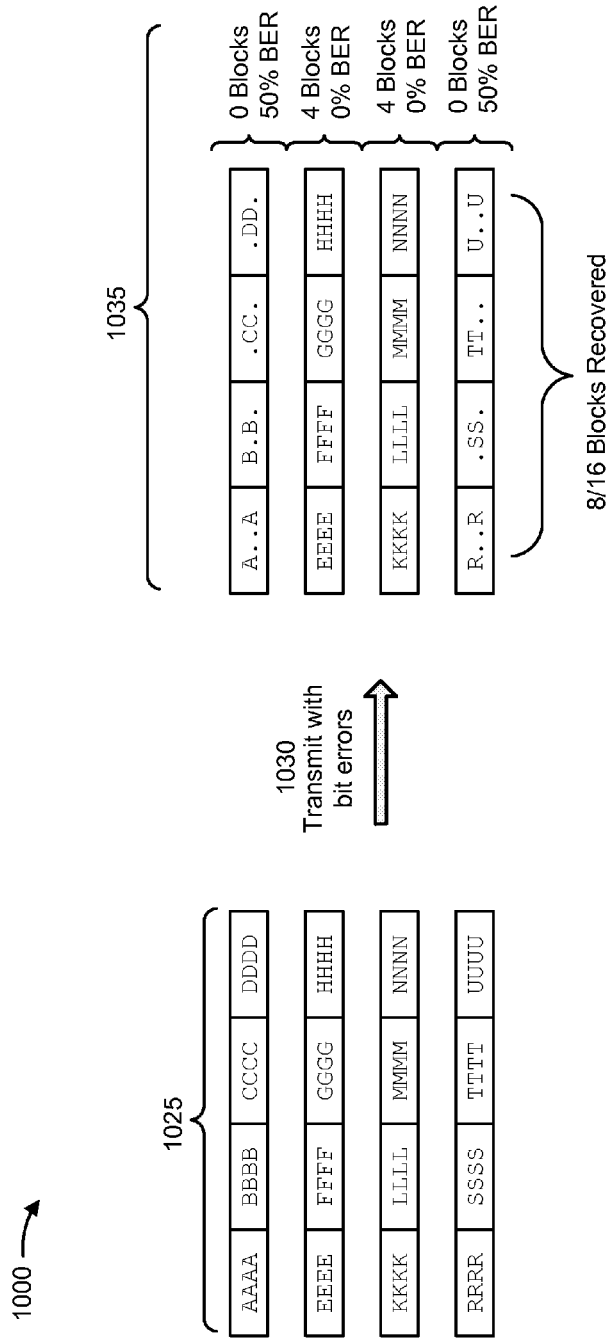

As shown in FIG. 10B, and by reference number 1025, a set of four channels include payload information with a set of redundant bits (e.g., "AAAA, BBBB, . . . ," "EEEE, FFFF, . . . ," etc.). Assume that the final block of each channel represents FEC data appended to each channel (e.g., "DDDD," "HHHH," "NNNN," and "UUUU"). Assume that the first channel and the fourth channel are edge channels and the second channel and the third channel are interior channels. As shown by reference number 1030, the set of four channels are transmitted without interleaving resulting in a set of bit errors. Assume that FEC may be performed to recover payload data if more than two bits of a four bit block are transmitted without error and that bit errors occur more commonly for data transmitted via the edge channels compared with the interior channels as a result of impairment by one or more pass-band filters associated with one or more WSSs (e.g., the edge channels are attenuated by the one or more pass-band filters more than the interior channels). As shown by reference number 1035, without performing interleaving, the edge channels incur 50% bit error rates while the interior channels incur 0% bit error rates as a result of impairment by the one or more pass-band filters. Based on the quantity of bits being successfully transmitted not exceeding two bits per block, only the 8 blocks of the interior channels, out of 16 blocks that are transmitted via the set of four channels, are recovered.

Figure 10C:
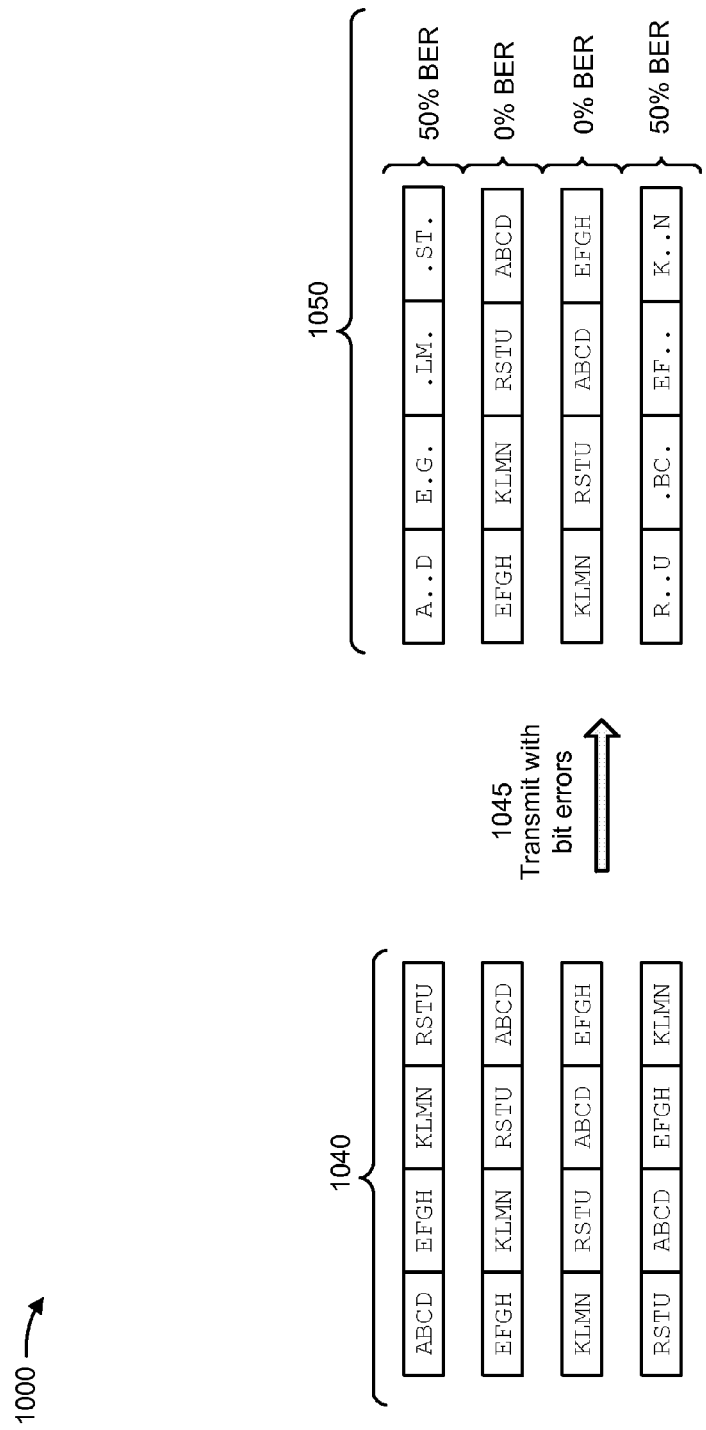

As shown in FIG. 10C, and by reference number 1040, assume that FEC interleaver 1010 performs FEC interleaving within each of the multiple channels and between the multiple channels. Bits of a particular channel are interleaved with other bits of the particular channel (e.g., "AAAA, BBBB, . . . " interleaves to "ABCD, ABCD, . . . ," "EEEE, FFFF, . . . " interleaves to "EFGH, EFGH, . . . ," etc.). Portions of each channel are interleaved with other portions of each channel (e.g., "ABCD, ABCD, . . . "

interleaves to "ABCD, EFGH, . . . . ," "KLMN, KLMN, . . . " interleaves to "KLMN, RSTU, . . . ," etc.). As shown by reference number 1045, the set of four channels are transmitted with interleaving of bits within each channel and with interleaving of portions of each channel among the multiple channels and incurring a set of bit errors. As shown by reference number 1050, prior to de-interleaving, the edge channels incur 50% bit error rates while the interior channels incur 0% bit error rates as a result of impairment by the pass-band filter.

Figure 10D:
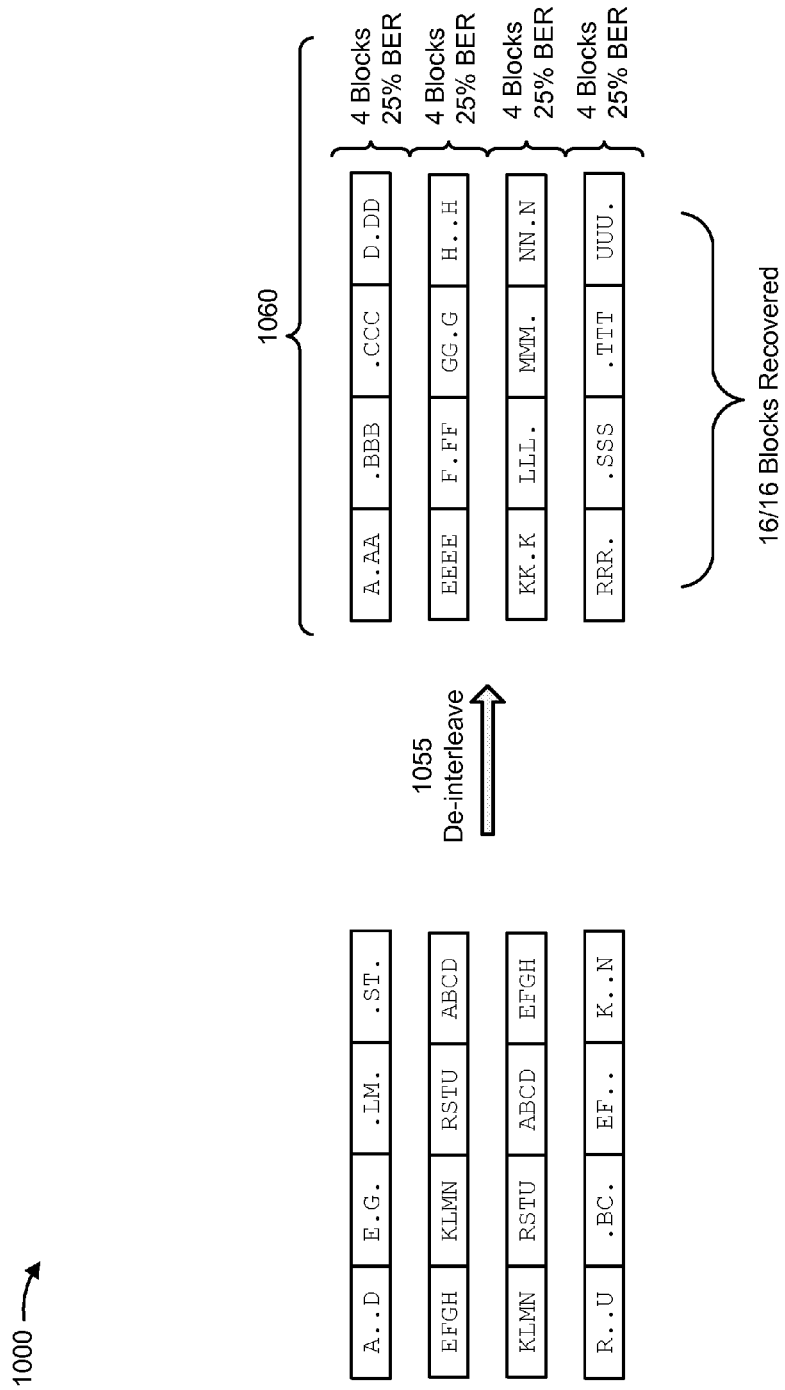

As shown in FIG. 10D, and by reference number 1055, FEC de-interleaver 1015 performs de-interleaving of the set of four interleaved channels (e.g., "A.D," "E.G.," etc. de-interleaves to "A.AA," ".BBB," etc.). When de-interleaved, each channel, of the set of four de-interleaved channels, incurs a 25% bit error rate. As shown by reference number 1060, FEC decoder 1020 performs FEC decoding on the set of four de-interleaved channels. As a result of the bit error rate being averaged across the set of four de-interleaved channels, 16 blocks, out of 16 transmitted blocks, are recovered based on performing FEC decoding. In this way, performing FEC interleaving between multiple channels results in greater information recovery of transmitted information than without FEC interleaving, thereby improving the field of optical network management through reduced information loss during optical transmissions.

In this way, multiple channels may be utilized to spread bit errors concentrated on edge channels among information of the multiple channels (e.g., that include the edge channels and one or more interior channels) to avoid a concentration of bit errors that may render FEC ineffective for recovering information of the edge channels.

As indicated above, FIGS. 10A-10D are provided merely as an example. Other examples are possible and may differ from what was described with regard to FIGS. 10A-10D.

Figure 11:
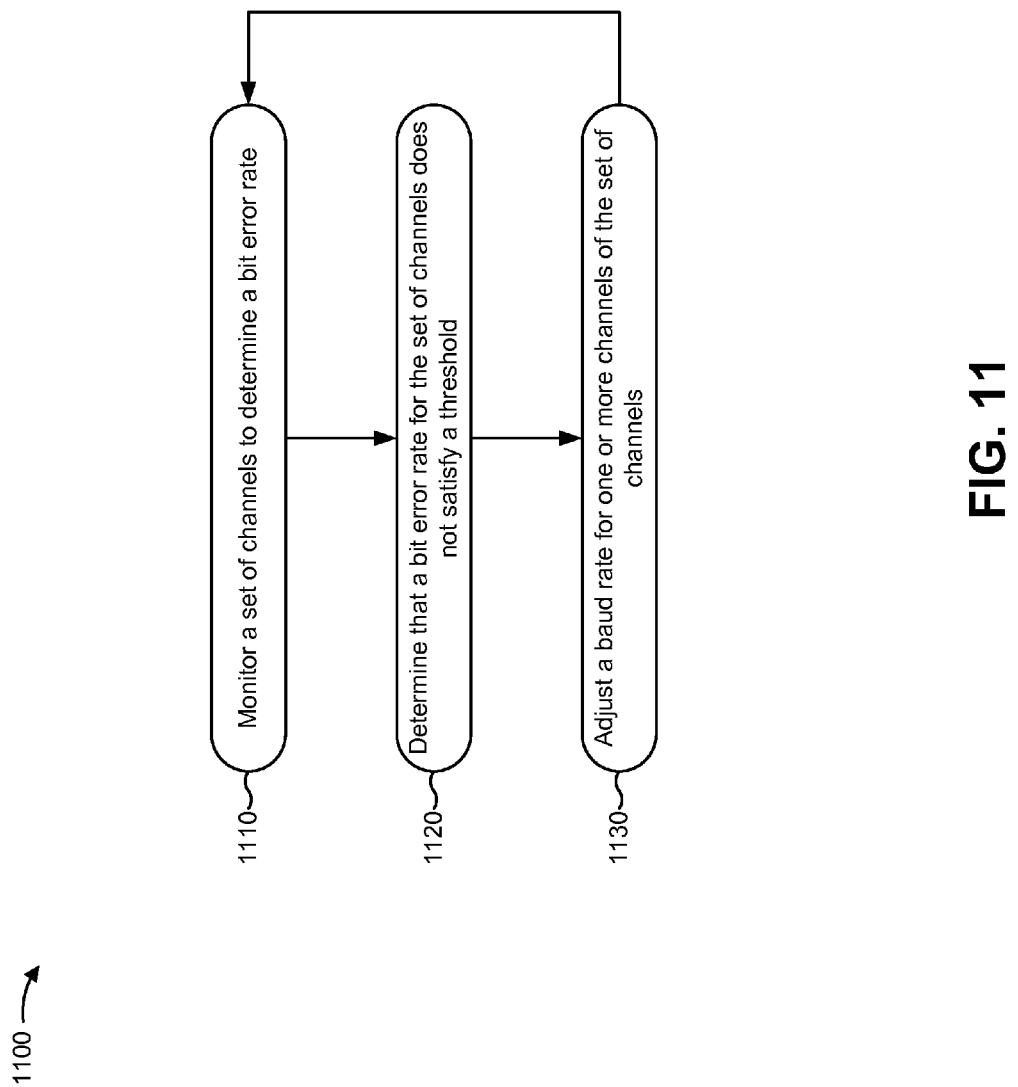
FIG. 11 is a flow chart of an example process for reducing WSS filter-based impairment using differentiated channel baud rates.

FIG. 11 is a flow chart of an example process 1100 for reducing WSS filter-based impairment using differentiated channel baud rates. In some implementations, one or more process blocks of FIG. 11 may be performed by network management device 210. In some implementations, one or more process blocks of FIG. 11 may be performed by another component or a set of components separate from or including network management device 210, such as network device 230 (e.g., Tx device 240, MUX 250, ROADM 260, DEMUX 270, Rx device 275) or the like.

As shown in FIG. 11, process 1100 may include monitoring a set of channels to determine a bit error rate (block 1110). For example, network management device 210 may monitor the set of channels to determine the bit error rate. In some implementations, network management device 210 may determine the bit error rate based on receiving information from one or more components of a transmitter, as discussed herein with respect to FIG. 5. In some implementations, network management device 210 may monitor the set of channels to determine another signal quality factor, such as a signal to noise ratio, a Q-factor, or the like.

As further shown in FIG. 11, process 1100 may include determining that a bit error rate for the set of channels does not satisfy a threshold (block 1120). For example, network management device 210 may determine that the bit error rate and/or a differential bit error rate associated with the bit error rate does not satisfy a particular threshold, as discussed herein with respect to FIG. 5. In some implementations, a particular baud rate may be associated with a particular bit error rate, when attenuated by a pass-band filter, and a particular data transmission rate. For example, for a first channel centered at a particular wavelength and with a first baud rate and a second channel centered at the particular wavelength and with a second baud rate, the first channel may be associated with a greater bit error rate than the second channel when the first baud rate is greater than the second baud rate, as discussed herein with respect to FIG. 12A.

In some implementations, network management device 210 may determine the threshold based on one or more network criteria. For example, network management device 210 may determine that a particular network usage should be associated with a particular data transfer rate and a particular bit error rate, and may select a threshold that balances reducing the particular bit error rate against reducing the particular data transfer rate. Additionally, or alternatively, network management device 210 may determine a set of thresholds. For example, network management device 210 may determine a first bit error rate threshold for a first network usage is associated with a first data transfer rate and a second bit error rate threshold for a second network usage is associated with a second data transfer rate.

In some implementations, network management device 210 may determine a network performance score based on a set of factors (e.g., a bit error rate factor, a data transfer rate factor, or the like), and may select a threshold based on the network performance score for a super-channel, for a particular channel, or the like. Additionally, or alternatively, network management device 210 may select the threshold based on determining an availability of one or more other techniques for reducing WSS filter-based impairment.

As further shown in FIG. 11, process 1100 may include adjusting a baud rate for one or more channels of the set of channels (block 1130). For example, network management device 210 may reduce WSS filter-based impairment using differentiated channel baud rates. Differentiated channel baud rates may refer to utilizing different baud rates for multiple channels. For example, network management device 210 may cause a first channel to be transmitted at a first baud rate and a second channel to be transmitted at a second baud rate.

In some implementations, network management device 210 may cause a particular channel to be transmitted at a particular baud rate that results in decreased bit error rate. For example, when a particular channel is associated with a greater bit error rate than another channel (e.g., caused by attenuation via a pass-band filter associated with WSS 320), network management device 210 may decrease a bit error rate associated with the particular channel by altering a baud rate from a first, comparatively higher baud rate to a second, comparatively lower baud rate. In this way, network management device 210 may reduce a differential bit error rate between the particular channel and the other channel.

In some implementations, network management device 210 may cause a particular channel to be transmitted at a particular baud rate that results in increased bit error rate. For example, when a particular channel is associated with a lesser bit error rate than another channel (e.g., caused by attenuation via a pass-band filter associated with WSS 320), network management device 210 may increase a bit error rate associated with the particular channel by altering a baud rate from a first, comparatively lower baud rate to a second, comparatively higher baud rate. In this way, network management device 210 may reduce a differential bit error rate between the particular channel and the other channel.

Additionally, or alternatively, when a particular channel is associated with a lower bit error rate than another channel, network management device 210 may increase a bit error rate associated with the particular channel by increasing the baud rate and may decrease a bit error rate associated with the other channel by lowering the baud rate, thereby decreasing a differential bit error rate between the particular channel and the other channel.

In some implementations, network management device 210 may cause a transmitter to redistribute information that was to be transferred via a channel. For example, network management device 210 may cause information associated with a first channel to be transmitted via a second channel based on altering a baud rate associated with the first channel and/or the second channel.

In some implementations, network management device 210 may perform one or more other techniques to reduce the impact of WSS filter-based impairment, such as using comparative channel pre-emphasis (e.g., as described herein with respect to FIG. 5), differentiated channel modulation formats (e.g., as described herein with respect to FIG. 7), multi-channel forward error correction interleaving (e.g., as described herein with respect to FIGS. 9A and 9B), selective subcarrier adjustment (e.g., as described herein with respect to FIG. 13), or the like. For example, network management device 210 may alter a baud rate from a first baud rate to a second baud rate and utilize multi-channel forward error correction interleaving to achieve greater bit error rate reduction than reducing the baud rate alone while mitigating the reduction in data rate associated with reducing the baud rate. In this way, network management device 210 may combine multiple techniques that reduce the impact of WSS filter-based impairment to achieve greater network performance than may be achieved utilizing a single technique.

In some implementations, network management device 210 may utilize a feedback loop to control a set of baud rates. For example, network management device 210 may monitor optical network 220 and return to block 1110.

Although FIG. 11 shows process 1100 as being performed by network management device 210, differentiated channel baud rates may be configured prior to installation of an optical transport network. For example, it may be determined, based on testing, simulation, or the like, that a particular bit error rate will be associated with a particular channel, a set of transmitters may be configured to utilize differentiated channel baud rates for multiple channels (without interaction with network management device 210), and a set of receivers may be configured to utilize differentiated channel baud rates for multiple channels (without interaction with network management device 210).

Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

Figure 12A:
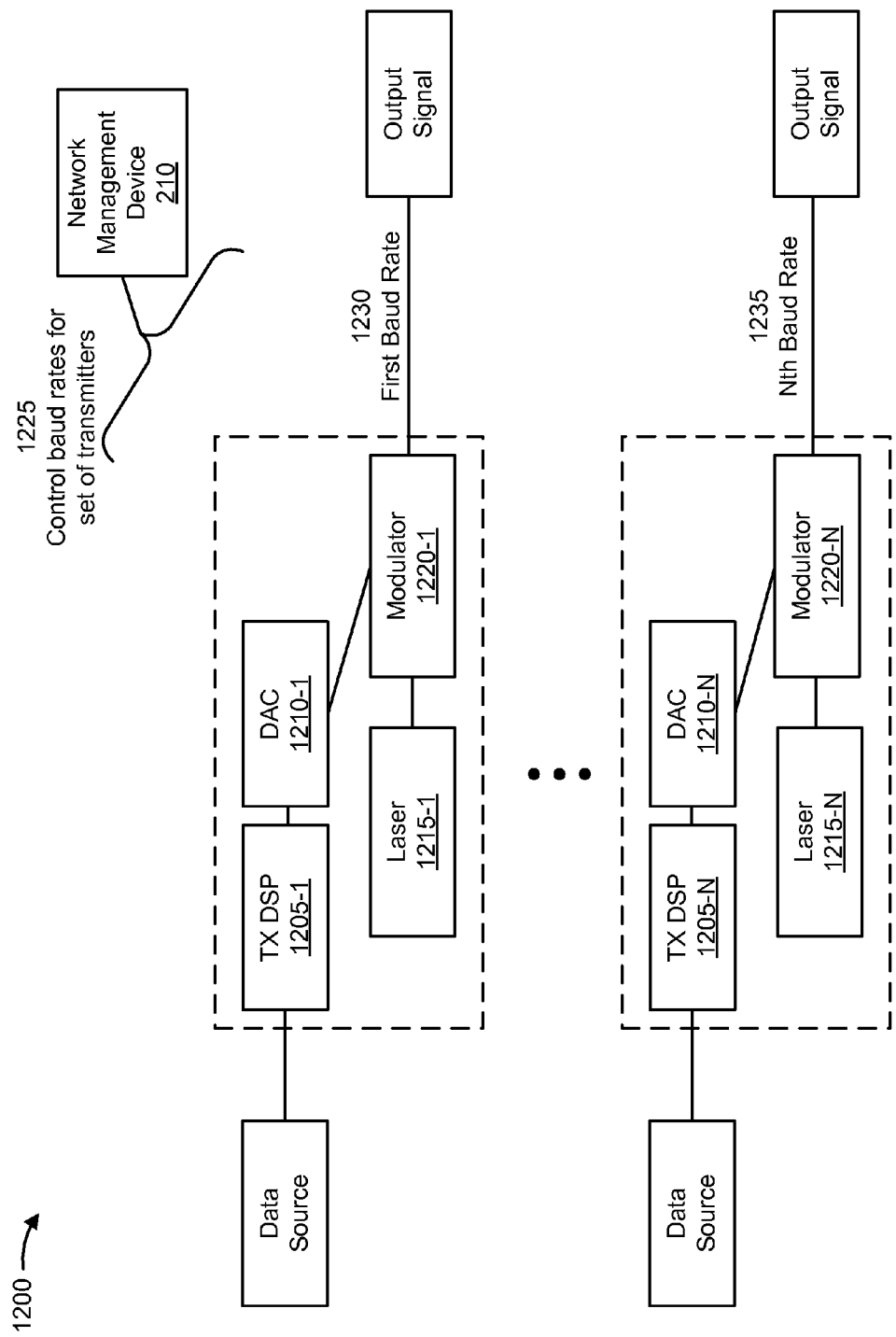
FIGS. 12A and 12B are diagrams of an example implementation relating to the example process shown in FIG. 11.
Figure 12B:
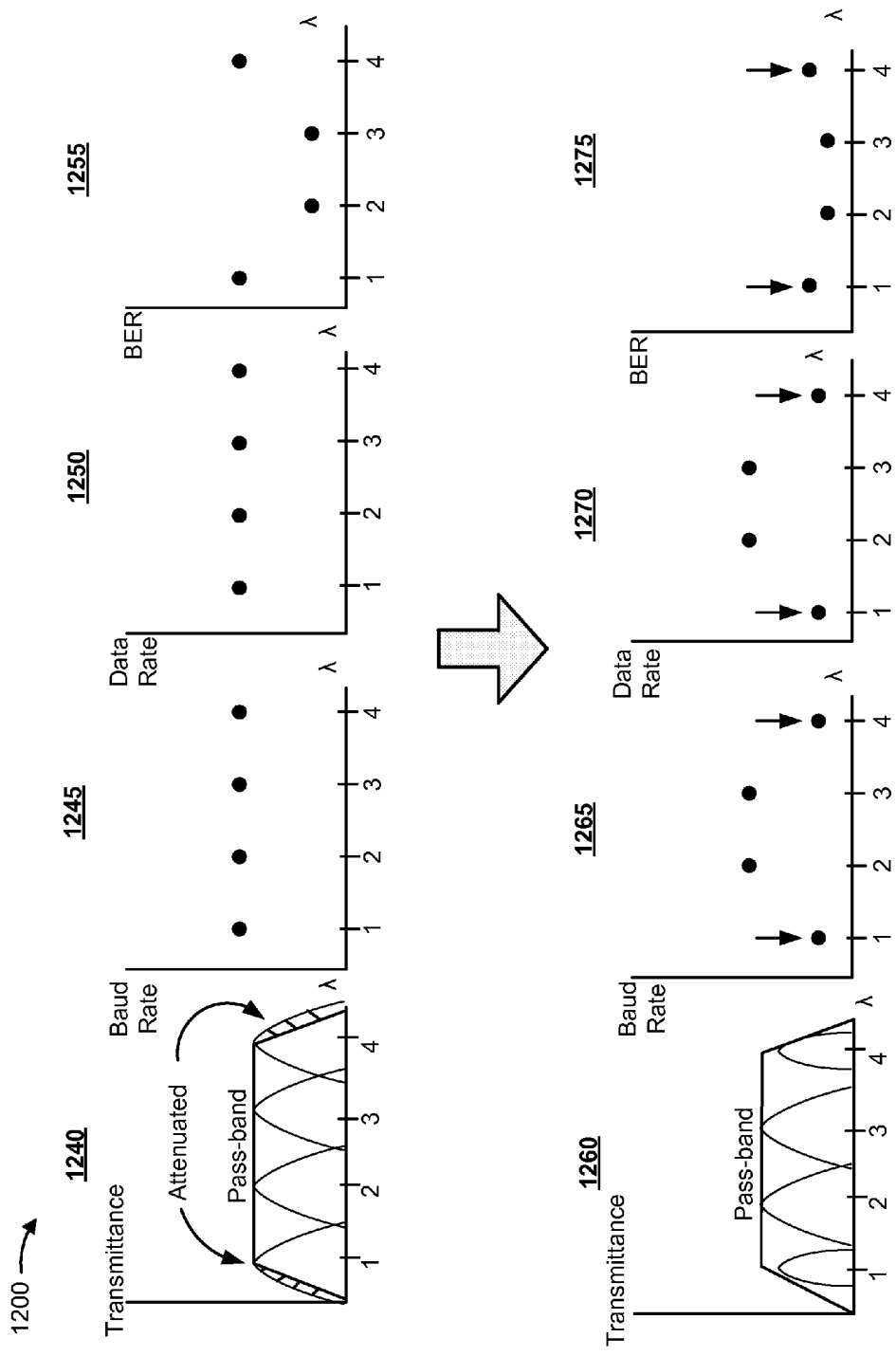

FIGS. 12A and 12B are diagrams of an example implementation 1200 relating to example process 1100 shown in FIG. 11. FIGS. 12A and 12B show an example of reducing WSS filter-based impairment using differentiated channel baud rates.

As shown in FIG. 12A, a set of transmitters of ROADM 260 may include one or more transmitter digital signal processors (Tx DSP) 1205, one or more digital-to-analog converters (DACs) 1210, one or more lasers 1215, and one or more modulators 1220. In some implementations, Tx DSPs 1205, DACs 1210, lasers 1215, and/or modulators 1220 may be implemented on one or more integrated circuits, such as one or more PICs, one or more ASICs, or the like. Tx DSP 1205 may include a digital signal processor or a collection of digital signal processors, DAC 1210 may include a digital-to-analog converter or a collection of digital-to-analog converters, laser 1215 may include a semiconductor laser or some other type of laser, and modulator 1220 may include a MZM modulator or another type of modulator, as described herein with respect to FIG. 6A.

In some implementations, a particular transmitter may be configured to provide information at a particular baud rate. For example, the particular transmitter may include a clock device configured to facilitate baud rate synchronization at the particular baud rate. Additionally, or alternatively, the particular transmitter may be configured to provide information at a set of baud rates. For example, the particular transmitter may include a dynamically reconfigurable clock device that may facilitate baud rate synchronization at multiple baud rates.

As further shown in FIG. 12A, and by reference number 1225, network management device 210 may control baud rates for the set of transmitters. As shown by reference number 1230, based on receiving information from network management device 210 indicating a particular baud rate, a first transmitter may provide information utilizing a first baud rate and, as shown by reference number 1235, an nth transmitter may provide information utilizing an nth baud rate.

As shown in FIG. 12B, and by reference number 1240, a pass-band (e.g., associated with a pass-band filter) describes attenuation of a set of channels (e.g., a first channel, a second channel, a third channel, and a fourth channel) associated with a set of wavelengths by a pass-band filter. Although each channel includes the same size width wavelength range, the first channel and the fourth channel include areas of respective wavelength ranges outside the wavelength range associated with the pass-band filter. As shown by reference number 1245, the set of channels are associated with the same baud rate, and as shown by reference number 1250, the set of channels are associated with the same data rate. As shown by reference number 1255, based on the wavelength ranges of the first channel and the fourth channel being outside the wavelength range associated with the pass-band filter, the first channel and the fourth channel are associated with higher bit error rates than the second channel and the third channel. Assume that one or more transmitters associated with transmitting a set of optical signals via the set of channels are reconfigured to utilize differentiated baud rates. As shown by reference number 1260, based on reducing a baud rate for the first channel and the fourth channel, the first channel and the fourth channel are associated with narrower respective wavelength ranges that are not outside the wavelength range associated with the pass-band filter. As shown by reference number 1265, the baud rate for the first channel and the fourth channel has been reduced to produce the altered wavelength ranges. As shown by reference number 1270, based on reducing the baud rate for the first channel and the fourth channel, the data rate for the first channel and the fourth channel is reduced. As shown by reference number 1275, based on reducing the baud rate for the first channel and the fourth channel, the bit error rate for the first channel and the fourth channel is reduced.

As indicated above, FIGS. 12A and 12B are provided merely as an example. Other examples are possible and may differ from what was described with regard to FIGS. 12A and 12B.

Figure 13:
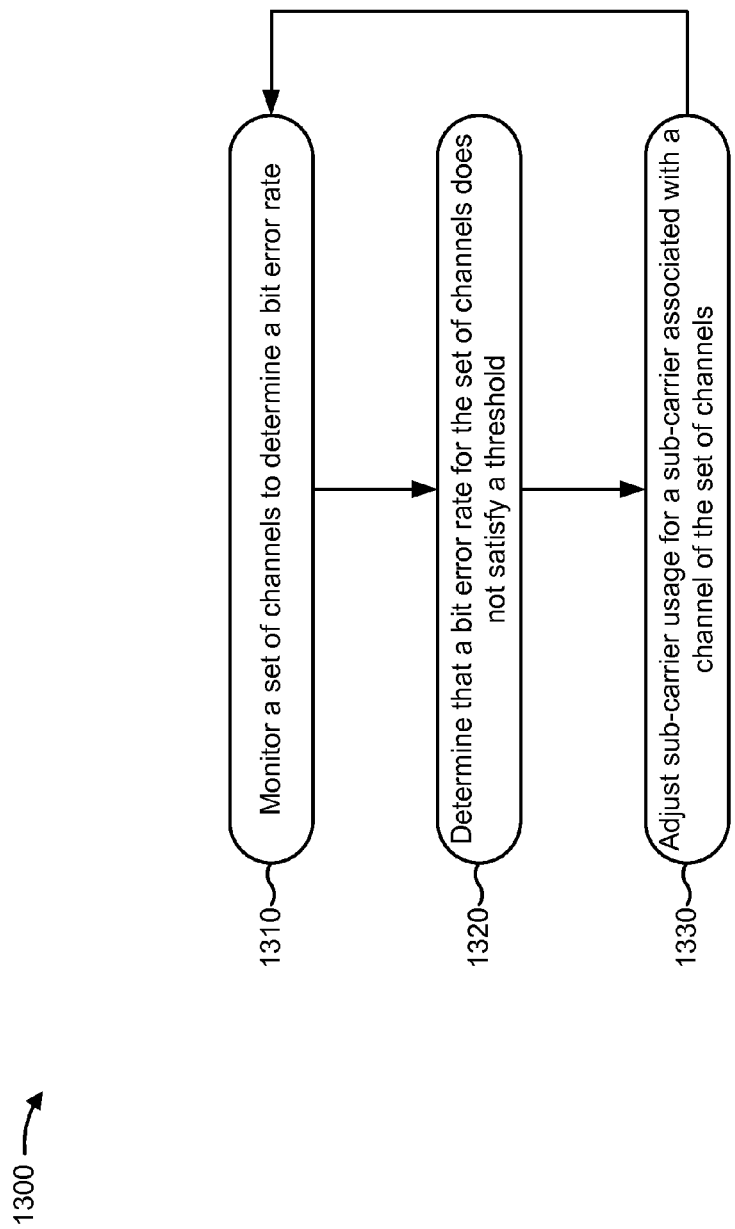
FIG. 13 is a flow chart of an example process for reducing WSS filter-based impairment using selective subcarrier adjustment.

FIG. 13 is a flow chart of an example process 1300 for reducing WSS filter-based impairment using selective subcarrier adjustment. In some implementations, one or more process blocks of FIG. 13 may be performed by network management device 210. In some implementations, one or more process blocks of FIG. 13 may be performed by another component or a set of components separate from or including network management device 210, such as network device 230 (e.g., Tx device 240, MUX 250, ROADM 260, DEMUX 270, Rx device 275) or the like.

As shown in FIG. 13, process 1300 may include monitoring a set of channels to determine a bit error rate (block 1310). For example, network management device 210 may monitor the set of channels to determine the bit error rate. In some implementations, network management device 210 may determine the bit error rate based on receiving information from one or more components of a transmitter, as discussed herein with respect to FIG. 5. In some implementations, network management device 210 may monitor the set of channels to determine another signal quality factor, such as a signal to noise ratio, a Q-factor, or the like.

As further shown in FIG. 13, process 1300 may include determining that a bit error rate for the set of channels does not satisfy a threshold (block 1320). For example, network management device 210 may determine that the bit error rate and/or a differential bit error rate does not satisfy a particular threshold, as discussed herein with respect to FIG. 5.

In some implementations, network management device 210 may determine the threshold based on one or more network criteria. For example, network management device 210 may determine that a particular network usage should be associated with a particular data transfer rate and a particular bit error rate, and may select a threshold that balances reducing the particular bit error rate against reducing the data transfer rate by selectively adjusting one or more subcarriers. In some implementations, network management device 210 may determine multiple thresholds. For example, network management device 210 may determine a first threshold associated with selectively adjusting a single subcarrier and a second threshold associated with selectively adjusting multiple subcarriers. In some implementations, network management device 210 may determine a predicted bit error rate reduction associated with selectively adjusting a particular subcarrier and may select a threshold based on the predicted bit error rate reduction.

In some implementations, network management device 210 may determine a network performance score based on a set of factors (e.g., a bit error rate factor, a data transfer rate factor, a predicted bit error rate reduction associated with adjusting a particular subcarrier, or the like), and may select a threshold based on the network performance score for a super-channel, for a particular channel, or the like. Additionally, or alternatively, network management device 210 may select a threshold based on determining an availability of one or more other techniques for reducing WSS filter-based impairment.

As further shown in FIG. 13, process 1300 may include adjusting subcarrier usage for a subcarrier associated with a channel of the set of channels (block 1330). For example, network management device 210 may reduce WSS filter-based impairment by adjusting a subcarrier usage for the subcarrier associated the channel of the set of channels. In some implementations, network management device 210 may select the subcarrier for which subcarrier usage is adjusted based on a set of factors, such as a projected bit error rate reduction/increase associated with adjusting the subcarrier usage, information regarding data being transferred via the subcarrier, or the like. In some implementations, network management device 210 may cause another device, such as a digital signal processor, or the like to adjust the subcarrier usage.

In some implementations, network management device 210 may cause a particular channel to be transmitted without a particular subcarrier by blanking the subcarrier. For example, when a particular channel is associated with a greater bit error rate than another channel (e.g., caused by attenuation via a pass-band filter associated with WSS 320), network management device 210 may decrease a bit error rate associated with the particular channel by blanking a particular subcarrier of the channel that is associated with a threshold bit error rate. In this way, network management device 210 may reduce a differential bit error rate between the particular channel and the other channel.

In some implementations, network management device 210 may alter the subcarrier. For example, network management device 210 may alter a set of bandwidths associated with the subcarrier, may reduce information being transmitted by the subcarrier, change information being transferred by the subcarrier, or the like to reduce a bit error rate associated with the subcarrier.

In some implementations, network management device 210 may cause a transmitter to redistribute information that was to be transferred via the subcarrier to one or more other subcarriers. In this way, network management device 210 may reduce a differential bit error rate between the particular channel and the other channel.

In some implementations, network management device 210 may perform one or more other techniques to reduce the impact of WSS filter-based impairment, such as using comparative channel pre-emphasis (e.g., as described herein with respect to FIG. 5), differentiated channel modulation formats (e.g., as described herein with respect to FIG. 7), multi-channel forward error correction interleaving (e.g., as described herein with respect to FIGS. 9A and 9B), differentiated channel baud rates (e.g., as described herein with respect to FIG. 11), or the like. For example, when network management device 210 may alter a omit information from a particular subcarrier and utilize multi-channel forward error correction interleaving to achieve greater bit rate reduction than omitting the particular subcarrier alone while mitigating the reduction in data rate associated with omitting multiple subcarriers. In this way, network management device 210 may combine multiple techniques that reduce the impact of WSS filter-based impairment to achieve greater optical transport network performance than may be achieved utilizing a single technique.

In some implementations, network management device 210 may utilize a feedback loop to control adjusting a subcarrier usage. For example, network management device 210 may monitor optical network 220 and return to block 1310.

Although FIG. 13 shows process 1300 as being performed by network management device 210, selective subcarrier adjustment may be configured prior to installation of an optical transport network. For example, it may be determined, based on testing, simulation, or the like, that a particular bit error rate will be associated with a particular subcarrier of a particular channel, a set of transmitters may be configured to adjust the particular subcarrier to reduce the bit error rate for the particular channel (without interaction with network management device 210), and a set of receivers may be configured to receive based on an adjustment to the particular subcarrier (without interaction with network management device 210).

Although FIG. 13 shows example blocks of process 1300, in some implementations, process 1300 may include additional blocks, fewer blocks, different blocks, or differently arranged blocks than those depicted in FIG. 13. Additionally, or alternatively, two or more of the blocks of process 1300 may be performed in parallel.

Figure 14A:
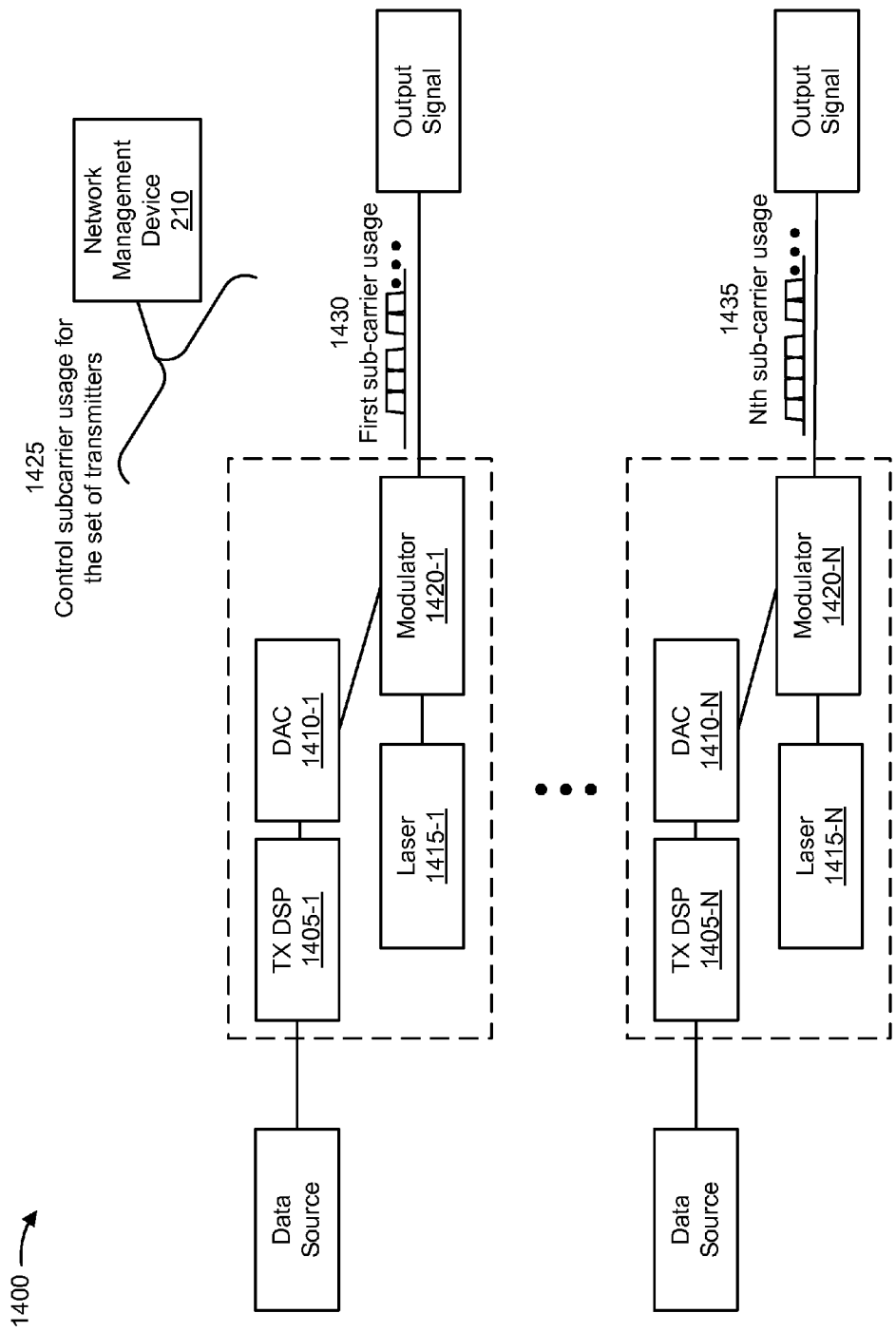
FIGS. 14A and 14B are diagrams of an example implementation relating to the example process shown in FIG. 13.
Figure 14B:
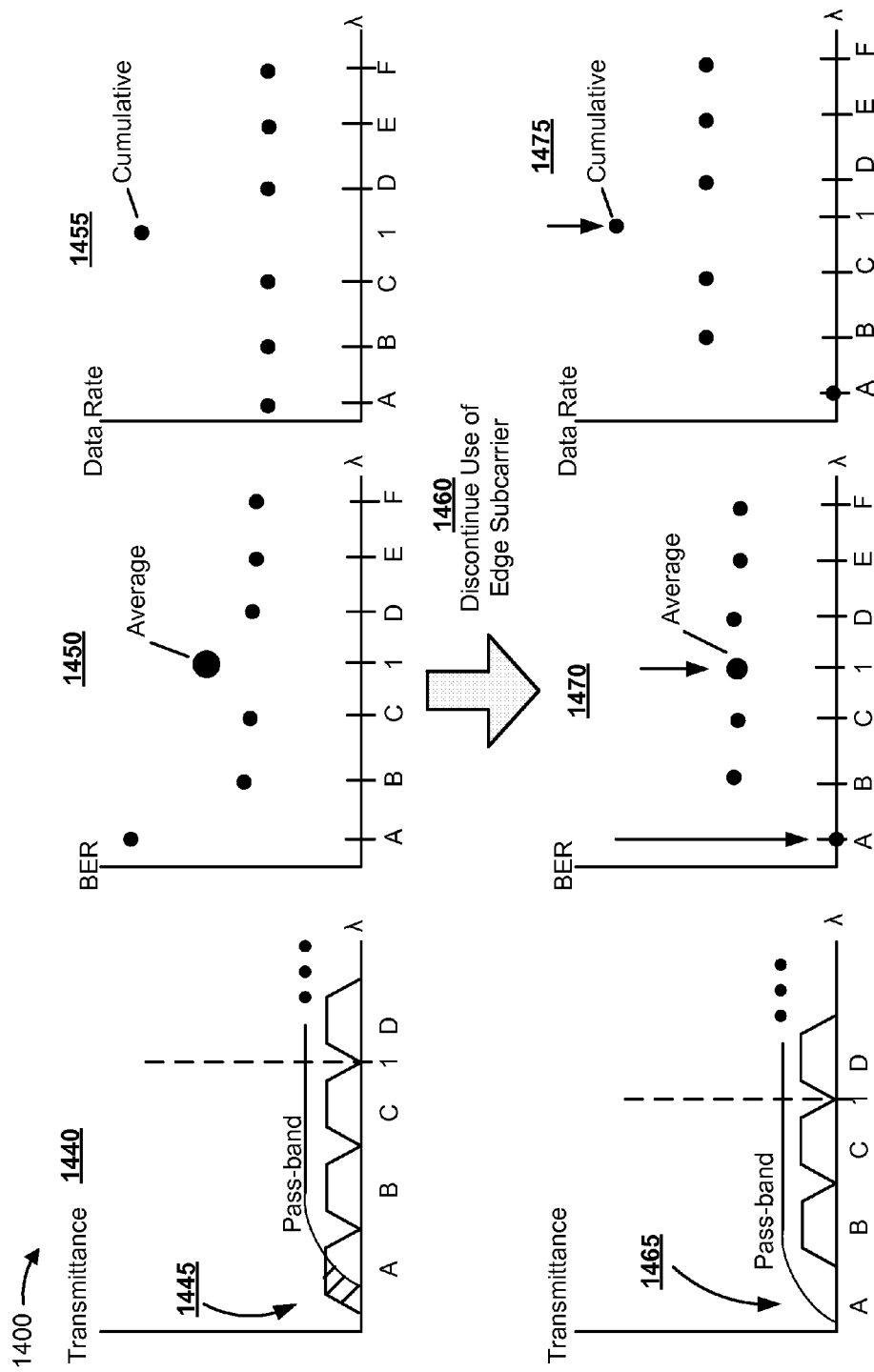

FIGS. 14A and 14B are diagrams of an example implementation 1400 relating to example process 1300 shown in FIG. 13. FIGS. 14A and 14B show an example of reducing a WSS filter-based impairment using selective subcarrier blanking.

As shown in FIG. 14A, a set of transmitters of ROADM 260, may include one or more transmitter digital signal processors (Tx DSPs) 1405, one or more digital-to-analog converters (DACs) 1410, one or more lasers 1415, and one or more modulators 1420. In some implementations, Tx DSPs 1405, DACs 1410, lasers 1415, and/or modulators 1420 may be implemented on one or more integrated circuits, such as one or more PICs, one or more ASICs, or the like. Tx DSP 1405 may include a digital signal processor or a collection of digital signal processors, DAC 1410 may include a digital-to-analog converter or a collection of digital-to-analog converters, laser 1415 may include a semiconductor laser or some other type of laser, and modulator 1420 may include a MZM modulator or another type of modulator, as described herein with respect to FIG. 6A.

As further shown in FIG. 14A, and by reference number 1425, network management device 210 controls subcarrier usage for the set of transmitters. As shown by reference number 1430, a first transmitter may provide a first transmission utilizing a first subcarrier usage (e.g., that includes a first channel with a first set of subcarriers, a second channel with a second set of subcarriers, etc.). As shown by reference number 1435, an nth transmitter may provide another transmission utilizing an nth subcarrier usage (e.g., that includes an ath channel with an ath set of subcarriers, a bth channel with a bth set of subcarriers, etc.).

As shown in FIG. 14B, and by reference number 1440, a first channel of a super-channel may include a set of subcarriers (e.g., subcarrier A, subcarrier B, subcarrier C, subcarrier D, etc.). As shown by reference number 1445, a portion of a set of wavelengths associated with subcarrier A is outside a wavelength range of a pass-band filter described by a pass-band and undergoes attenuation when transmitted through the pass-band filter. As shown by reference number 1450, a set of bit error rates for the set of subcarriers indicates that subcarrier A has a higher bit error rate than other subcarriers, of the set of subcarriers, and a higher bit error rate than the average bit error rate of the first channel. As shown by reference number 1455, each subcarrier is associated with the same data rate, and collectively a particular cumulative data rate associated with the first channel. As shown by reference number 1460, network management device 210 (not shown) may indicate that a transmitter associated with transmitting the first channel is to discontinue use of an edge subcarrier (e.g., subcarrier A). As shown by reference number 1460, usage of subcarrier A is discontinued. As shown by reference number 1465, subcarrier A no longer contributes bit errors to a bit error rate associated with the first channel and the average bit error rate associated with the first channel decreases accordingly. As shown by reference number 1470, subcarrier A no longer transfers data for the first channel and the cumulative data rate for the first channel decreases accordingly.

As indicated above, FIGS. 14A and 14B are provided merely as an example. Other examples are possible and may differ from what was described with regard to FIGS. 14A and 14B.

FIG. 15 is a diagram of example components of a device 1500. Device 1500 may correspond to network management device 210, network device 230, and/or another device described herein. In some implementations, network management device 210, network device 230, and/or another device described herein may include one or more devices 1500 and/or one or more components of device 1500. As shown in FIG. 15, device 1500 may include a bus 1510, a processor 1520, a memory 1530, a storage component 1540, an input component 1550, an output component 1560, and a communication interface 1570.

Bus 1510 may include a component that permits communication among the components of device 1500. Processor 1520 is implemented in hardware, firmware, or a combination of hardware and software. Processor 1520 may include a processor (e.g., a central processing unit (CPU), a graphics processing unit (GPU), an accelerated processing unit (APU), etc.), a microprocessor, and/or any processing component (e.g., a field-programmable gate array (FPGA), an application-specific integrated circuit (ASIC), etc.) that interprets and/or executes instructions. Memory 730 may include a random access memory (RAM), a read only memory (ROM), and/or another type of dynamic or static storage device (e.g., a flash memory, a magnetic memory, an optical memory, etc.) that stores information and/or instructions for use by processor 1520.

Storage component 1540 may store information and/or software related to the operation and use of device 1500. For example, storage component 1540 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive.

Input component 1550 may include a component that permits device 1500 to receive information, such as via user input (e.g., a touch screen display, a keyboard, a keypad, a mouse, a button, a switch, a microphone, etc.). Additionally, or alternatively, input component 1550 may include a sensor for sensing information (e.g., a global positioning system (GPS) component, an accelerometer, a gyroscope, an actuator, etc.). Output component 1560 may include a component that provides output information from device 1500 (e.g., a display, a speaker, one or more light-emitting diodes (LEDs), etc.).

Communication interface 1570 may include a transceiver-like component (e.g., a transceiver, a separate receiver and transmitter, etc.) that enables device 1500 to communicate with other devices, such as via a wired connection, a wireless connection, or a combination of wired and wireless connections. Communication interface 1570 may permit device 1500 to receive information from another device and/or provide information to another device. For example, communication interface 1570 may include an Ethernet interface, an optical interface, a coaxial interface, an infrared interface, a radio frequency (RF) interface, a universal serial bus (USB) interface, a Wi-Fi interface, a cellular network interface, or the like.

Device 1500 may perform one or more processes described herein. Device 1500 may perform these processes in response to processor 1520 executing software instructions stored by a computer-readable medium, such as memory 1530 and/or storage component 1540. A computer-readable medium is defined herein as a non-transitory memory device. A memory device includes memory space within a single physical storage device or memory space spread across multiple physical storage devices.

Software instructions may be read into memory 1530 and/or storage component 1540 from another computer-readable medium or from another device via communication interface 770. When executed, software instructions stored in memory 1530 and/or storage component 1540 may cause processor 1520 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 15 are provided as an example. In practice, device 1500 may include additional components, fewer components, different components, or differently arranged components than those shown in FIG. 15. Additionally, or alternatively, a set of components (e.g., one or more components) of device 1500 may perform one or more functions described as being performed by another set of components of device 1500.

In this way, a set of network devices may provide CDC broadcast multiplexing and a set of techniques may reduce WSS filter-based impairment associated with the set of network devices and/or another set of network devices.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method, comprising:
   interleaving, by an optical device, a set of bits of a first channel with a set of bits of a second channel,
      the first channel including first forward error correction (FEC) data associated with the set of bits of the first channel and the second channel including second FEC data associated with the set of bits of the second channel,
      the first channel and the second channel being routed via a wavelength selective switch, that includes an optical filter, toward a receiver; and
   transmitting, by the optical device, first information via the first channel and second information via the second channel based on interleaving the set of bits of the first channel with the set of bits of the second channel,
      the first information including a portion of the set of bits of the first channel and a portion of the set of bits of the second channel,
      the second information including another portion of the set of bits of the first channel and another portion of the set of bits of the second channel.

2. The method of claim 1, further comprising:
   de-interleaving the first information and the second information based on transmitting the first information and the second information; and
   recovering information associated with the set of bits of the first channel using the first FEC data and the set of bits of the second channel using the second FEC data based on de-interleaving the first information and the second information.

3. The method of claim 1, further comprising:
   interleaving bits of the first channel within the first channel.

4. The method of claim 1, further comprising:
   generating the first FEC data based on encoding the set of bits of the first channel.

5. The method of claim 1, where transmitting the first information further comprises:
   transmitting the first information via a passive power splitter,
      the passive power splitter being associated with providing a power-split portion of the first information to a plurality of wavelength selective switches,
      the plurality of wavelength selective switches including the wavelength selective switch.

6. The method of claim 1, where interleaving the set of bits of the first channel and the set of bits of the second channel further comprises:
   associating the portion of the set of bits of the first channel with the first channel and the other portion of the set of bits of the first channel with the second channel; and
   associating the portion of the set of bits of the second channel with the first channel and the other portion of the set of bits of the second channel with the second channel.

7. The method of claim 1, further comprising:
   providing information associated with de-interleaving the first information and the second information.

8. A system, comprising:
one or more optical devices configured to:
generate first forward error correction information associated with a first channel and second forward error correction information associated with a second channel;
interleave first portions of bits associated with the first channel and second portions of bits associated with the second channel,
the first channel and the second channel being associated with a super-channel;
transmit one or more optical signals associated with the first channel and the second channel based on interleaving the first portions of bits and the second portions of bits;
de-interleave the first portions of bits and the second portions of bits after transmitting the one or more optical signals; and
recover information transmitted via the first channel and the second channel based on de-interleaving the first portions of bits and the second portions of bits and based on the first forward error correction information and the second forward error correction information.

9. The system of claim 8, where the one or more optical devices are further configured to:
determine that a threshold is satisfied,
the threshold being associated with a bit error rate for the first channel; and
where the one or more optical devices, when interleaving the first portions of bits associated with the first channel and the second portions of bits associated with the second channel, are further to:
interleave the first portions of bits and the second portions of bits based on determining that the threshold is satisfied.

10. The system of claim 8, where the one or more optical devices are further configured to:
determine that a differential bit error rate threshold for the first channel and the second channel is satisfied,
the differential bit error rate threshold being based on a first bit error rate for the first channel and a second bit error rate for the second channel; and
where the one or more optical devices, when interleaving the first portions of bits associated with the first channel and the second portions of bits associated with the second channel, are further to:
interleave the first portions of bits and the second portions of bits based on determining that the differential bit error rate threshold is satisfied.

11. The system of claim 8, where the one or more optical devices, when transmitting the one or more optical signals, are further configured to:
transmit the one or more optical signals via a passive power splitter,
the passive power splitter being associated with providing power-split portions of the one or more optical signals to a plurality of wavelength selective switches.

12. The system of claim 8, where the one or more optical devices, when transmitting the one or more optical signals, are further configured to:
transmit the one or more optical signals via a wavelength selective switch,
the wavelength selective switch including a filter associated with selectively routing a portion of the one or more optical signals toward a receiver.

13. The system of claim 8, where the one or more optical devices are further configured to:
receive the one or more optical signals via a receiver,
the one or more optical signals including the interleaved first portions of bits and second portions of bits.

14. The system of claim 8, where the one or more optical devices are further configured to:
interleave third portions of bits associated with a third channel with the first portions of bits and the second portions of bits; and
where the one or more optical devices, when de-interleaving the first portions of bits and the seconds portion of bits, are further to:
de-interleave the third portions of bits.

15. An system, comprising:
one or more optical devices configured to:
interleave a first set of portions of a first set of optical signals with a second set of portions of a second set of optical signals,
the first set of portions being associated with first forward error correction information associated with recovering the first set of portions when the first set of optical signals is attenuated by a filter,
the second set of portions being associated with second forward error correction information associated with recovering the second set of portions when the second set of optical signals is attenuated by the filter,
the first set of optical signals being associated with a first channel of a super-channel and the second set of optical signals being associated with a second channel of the super-channel; and
transmit the first set of portions and the second set of portions based on interleaving the first set of portions and the second set of portions.

16. The system of claim 15, where the one or more optical devices are further to:
determine that a signal quality factor threshold is satisfied; and
where the one or more optical devices, when interleaving the first set of portions with the second set of portions, are further to:
interleave the first set of portions and the second set of portions based on determining that the signal quality factor threshold is satisfied.

17. The system of claim 15, where the one or more optical devices are further to:
interleave bits of the first channel within the first channel; and
interleave bits of the second channel within the second channel.

18. The system of claim 15, where the first set of optical signals is associated with a first wavelength range that is associated with a first bit error rate; and
where the second set of optical signals is associated with a second wavelength range that is associated with a second bit error rate.

19. The system of claim 18, where the one or more optical devices are further to:
determine that an average bit error rate associated with the first bit error rate and the second bit error rate satisfies a forward error correction threshold,
the forward error correction threshold being associated with recovering information that includes a set of bit errors; and where the one or more optical devices, when interleaving the first set of portions and the second set of portions, are further to:
interleave the first set of portions and the second set of portions based on determining that the average bit error rate associated with the first bit error rate and the second bit error rate satisfies the forward error correction threshold.

20. The system of claim 15, where the one or more optical devices are further to:
generate the first forward error correction information and the second forward error correction information.

\* \* \* \* \*